(12) United States Patent
Wakamori et al.

(10) Patent No.: US 10,453,587 B2
(45) Date of Patent: Oct. 22, 2019

(54) CONDUCTOR ASSEMBLY, ELECTRONIC COMPONENT USING SAME, AND MANUFACTURING METHOD THEREOF

(71) Applicant: Panasonic Intellectual Property Management Co., Ltd., Osaka (JP)

(72) Inventors: Ikuya Wakamori, Hyogo (JP); Kengo Nakamura, Hyogo (JP); Mutsuyasu Ohtsubo, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/564,442

(22) PCT Filed: Dec. 15, 2016

(86) PCT No.: PCT/JP2016/005138
§ 371 (c)(1),
(2) Date: Oct. 5, 2017

(87) PCT Pub. No.: WO2017/110064
PCT Pub. Date: Jun. 29, 2017

(65) Prior Publication Data
US 2018/0082764 A1 Mar. 22, 2018

(30) Foreign Application Priority Data

Dec. 22, 2015 (JP) .................................. 2015-250147
Jan. 21, 2016 (JP) .................................. 2016-009421

(51) Int. Cl.
*H01R 4/02* (2006.01)
*H01B 5/00* (2006.01)
(Continued)

(52) U.S. Cl.
CPC ............. *H01B 5/00* (2013.01); *B23K 11/115* (2013.01); *B23K 11/14* (2013.01); *B23K 11/16* (2013.01);
(Continued)

(58) Field of Classification Search
CPC ........................................................ H01R 4/02
(Continued)

(56) References Cited

U.S. PATENT DOCUMENTS 1,498,520 A * 6/1924 Blackmore ........... B23P 15/002
                                                        123/188.3
2,707,889 A * 5/1955 Bagnold ................. B23K 20/02
                                                        228/115

(Continued)

FOREIGN PATENT DOCUMENTS

JP   2000-334573   12/2000
JP   2002-346757   12/2002
(Continued)

OTHER PUBLICATIONS

International Search Report of PCT application No. PCT/JP2016/005138 dated Mar. 7, 2017.

*Primary Examiner* — Chau N Nguyen
(74) *Attorney, Agent, or Firm* — McDermott Will & Emery LLP

(57) ABSTRACT

A conductor assembly includes a first conductor made of metal and a second conductor bonded to the first conductor. The second conductor is made of a metal plate having first and second surfaces opposite to each other. The second conductor has a projection locally projecting from the first surface. A recess is provided in the second surface of the second conductor opposite to the projection. The projection of the second conductor has a portion contacting and entering into the first conductor. The projection of the second (Continued)

conductor is resistance-welded to the first conductor. The portion of the projection of the second conductor has two tips locally projecting from the portion of the projection of the second conductor and entering the first conductor.

26 Claims, 15 Drawing Sheets

(51) Int. Cl.
| | | |
|---|---|---|
| *B23K 11/14* | (2006.01) | |
| *H01B 13/00* | (2006.01) | |
| *H05K 3/20* | (2006.01) | |
| *H05K 3/32* | (2006.01) | |
| *B23K 11/11* | (2006.01) | |
| *B23K 11/16* | (2006.01) | |
| *H01R 43/02* | (2006.01) | |
| *B23K 101/38* | (2006.01) | |
| *B23K 103/12* | (2006.01) | |

(52) U.S. Cl.
CPC .......... *H01B 13/0026* (2013.01); *H05K 3/20* (2013.01); *H05K 3/328* (2013.01); *B23K 2101/38* (2018.08); *B23K 2103/12* (2018.08); *H01R 4/023* (2013.01); *H01R 43/0214* (2013.01)

(58) Field of Classification Search
USPC .......................................... 174/94 R; 228/115
See application file for complete search history.

(56) References Cited

U.S. PATENT DOCUMENTS

| | | | | |
|---|---|---|---|---|
| 3,114,030 A | * | 12/1963 | Ruskin | B23K 11/14 |
| | | | | 219/93 |
| 4,315,175 A | * | 2/1982 | Hamilton | H01R 4/029 |
| | | | | 174/90 |
| 7,150,391 B2 | * | 12/2006 | Fujimoto | B23K 9/0026 |
| | | | | 228/252 |
| 7,490,835 B2 | * | 2/2009 | Diez | F16J 15/0825 |
| | | | | 277/593 |
| 9,937,582 B2 | * | 4/2018 | Sunaga | B23K 11/00 |
| 2008/0113526 A1 | | 5/2008 | Nakatani et al. | |
| 2009/0316418 A1 | * | 12/2009 | Mittler | B23K 33/00 |
| | | | | 362/362 |
| 2017/0186531 A1 | | 6/2017 | Ohtsubo et al. | |

FOREIGN PATENT DOCUMENTS

| | | |
|---|---|---|
| JP | 2003-022916 | 1/2003 |
| JP | 2003-175812 | 6/2003 |
| JP | 2008-123922 | 5/2008 |
| JP | 2009-266872 | 11/2009 |
| JP | 2011-255414 | 12/2011 |
| WO | 2016/006200 | 1/2016 |

* cited by examiner

CONDUCTOR ASSEMBLY, ELECTRONIC COMPONENT USING SAME, AND MANUFACTURING METHOD THEREOF

This application is a U.S. national stage application of the PCT international application No. PCT/JP2016/005138 filed on Dec. 15, 2016, which claims the benefit of foreign priority of Japanese patent application No. 2015-250147 filed on Dec. 22, 2015 and Japanese patent application No. 2016-009421 filed on Jan. 21, 2016, the contents all of which are incorporated herein by reference.

TECHNICAL FIELD

The present invention relates to a conductor assembly for connecting circuits of an electronic device, to an electronic component including the conductor assembly, and to a method of manufacturing the conductor assembly.

BACKGROUND ART

Two conductive metal plates are stacked and bonded by resistance-welding so as to connect circuits of an electronic device. A current is applied for the resistance-welding of metal plates while a pressure is applied by sandwiching both sides of the stacked metal plates with electrodes, so as to bond the metal plates by spot welding performed by generated resistance heat.

In order to reduce power consumption by the electronic device, a conductive copper material is used for a conductor, such as a bus bar, for connecting circuits. The resistance of copper material is small, and can hardly generate resistance heat on spot welding. Accordingly, a projection is provided on a conductor, and a tip of this projection is attached to a welding part of the other conductor and then a current is applied in embossing projection welding, so as to concentrate a current on the tip of projection to generate resistance heat for bonding two conductors.

PTL1 discloses a technique achieving good welding condition without collapsing a tip of a projection and biting into the other bus bar on welding by providing a smoothly-curved projection on one conductor.

CITATION LIST

Patent Literature

PTL1: Japanese Patent Laid-Open Publication No. 2003-175812

SUMMARY

A conductor assembly includes a first conductor made of metal and a second conductor bonded to the first conductor. The second conductor is made of a metal plate with first and second surfaces opposite to each other. The second conductor includes a projection locally projecting from the first surface. A recess is provided in the second surface of the second conductor opposite to the projection. The projection of the second conductor has a portion contacting and entering into the first conductor. The projection of the second conductor is bonded to the first conductor by resistance-welding. The portion of the projection of the second conductor includes two tips locally projecting from the portion of the projection of the second conductor and entering into the first conductor.

In this conductor assembly, two conductors are bonded with high bonding strength.

An electronic component includes a circuit element including a lead-out conductor made of metal, a body accommodating therein the circuit element, and a terminal conductor resistance-welded to the lead-out conductor of the circuit element. The terminal conductor is made of a metal plate having a first surface and a second surface opposite to the first surface. The lead-out conductor of the circuit element is resistance-welded to the first surface of the terminal conductor. Plural recesses locally depressed in the first surface of the terminal conductor. The terminal conductor includes plural protrusions each protruding from the second surface opposite to respective one of the recesses, and a projection locally projecting from bottom surfaces of the recesses between the bottom surfaces of the recesses. The projection of the terminal conductor has a portion contacting and entering into the lead-out conductor. The portion of the projection of the terminal conductor is bonded to the lead-out conductor.

DETAIL DESCRIPTION OF EMBODIMENTS

Exemplary Embodiment 1

Figure 1:
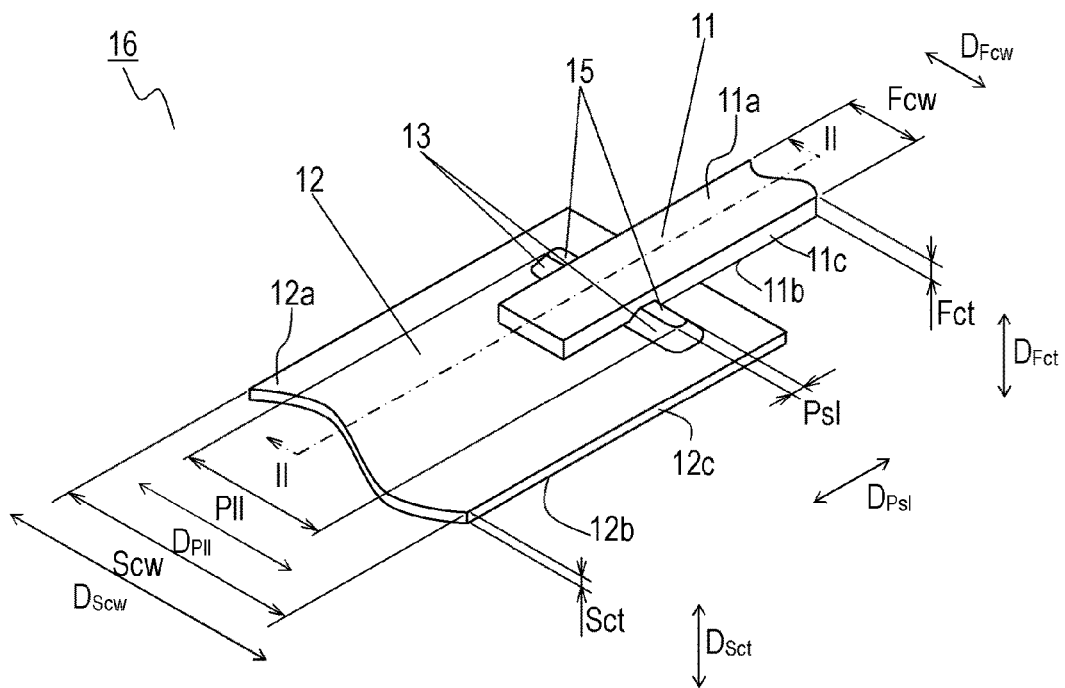
FIG. 1 is a perspective view of a conductor assembly in accordance with Exemplary Embodiment 1.
Figure 2:
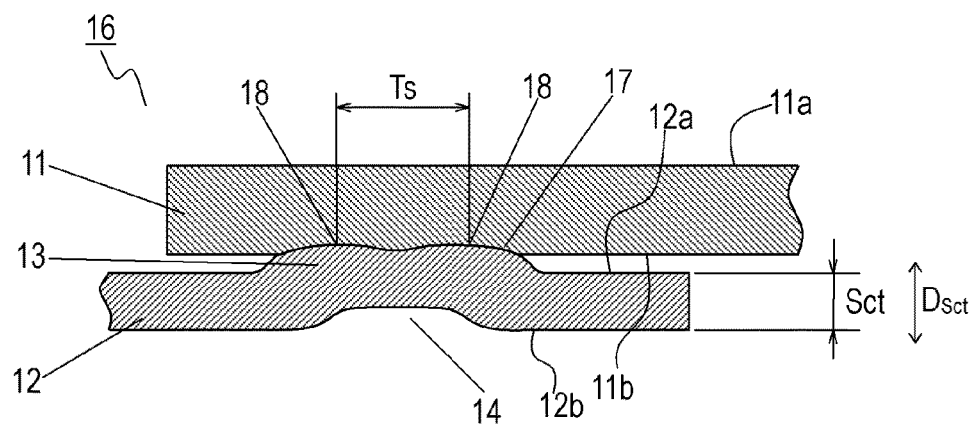
FIG. 2 is a sectional view of the conductor assembly along line II-II shown in FIG. 1.

FIG. 1 is a perspective view of conductor assembly 16 in accordance with Exemplary Embodiment 1. FIG. 2 is a sectional view of conductor assembly 16 along line II-II shown in FIG. 1. Conductor assembly 16 includes conductor 11 made of metal and conductor 12 made of a metal plate bonded to conductor 11. In accordance with Embodiment 1, conductor 11 is made of a metal plate. The metal plate of conductor 11 has surface 11a and surface 11b opposite to surface 11a. The metal plate of conductor 12 has surface 12a and surface 12b opposite to surface 12a. Conductor 12 includes projection 13 locally projecting from surface 12a. In accordance with Embodiment 1, projection 13 is embossed from surface 12b to surface 12a of conductor 12. Accordingly, as shown in FIG. 2, recess 14 is provided in surface 12b of conductor 12 at a position opposite to projection 13. Projection 13 of conductor 12 contacts surface 11b of conductor 11. Embossing projection welding is performed by resistance-welding to bond conductor 11 onto conductor 12.

Conductor 11 is an end part of a circuit element, such as a coil element made of a metal wire made of pure copper wound spirally. This metal wire has a flat cross section. This metal wire may have a cross section having a shape, such as a round shape, other than the flat shape. In this case, the cross section of the end part of the metal wire may be pressed to have a flat cross section. In accordance with Embodiment 1, length Fct in thickness direction $D_{Fct}$, a distance between surfaces 11a and 11b of conductor 11 is 0.23 mm Length Fct is a width of surface 11c connected to surfaces 11a and 11b of conductor 11. Surface 11b parallel to width direction $D_{Fcw}$ out of surface 11b parallel to width direction $D_{Fcw}$ and surface 11c parallel to thickness direction $D_{Fct}$ is a surface to be welded to conductor 12.

In accordance with Embodiment 1, conductor 12 is made of pure copper. Conductor 12 is formed by pressing a metal plate, and has an end part to be connected to conductor 11 and an end part to be connected to a circuit board. Conductor 12 is used as an external connecting terminal of the circuit element. In accordance with Embodiment 1, length Sct in thickness direction $D_{Sct}$, a distance between surfaces 12a and 12b of conductor 12 is 0.15 mm Length Sct is a width of surface 12c connected to surfaces 12a and 12b of conductor 12. Length Scw of conductor 12 in width direction $D_{Scw}$ is longer than length Fcw in width direction $D_{Fcw}$ of conductor 11. Surface 12a parallel to width direction $D_{Scw}$ out of surface 12a parallel to width direction $D_{Scw}$ and surface 12c parallel to thickness direction $D_{Sct}$ of conductor 12 is a surface to be welded to conductor 11.

Conductor 12 includes projection 13 formed by raising surface 12a by pressing surface 12b opposite to surface 12a before the embossing projection welding. Recess 14 is provided at the back of projection 13.

Projection 13 extends slenderly in longitudinal direction $D_{Pll}$ parallel to surface 12a. Flat part 15 is provided at a tip of projection 13. Flat part 15 has a shape, such as a rectangular shape or an oval shape, extending slenderly in longitudinal direction $D_{Pll}$ viewing in a direction facing surface 12a. In other words, length Pll of flat part 15 in longitudinal direction $D_{Pll}$ is longer than length Psl in lateral direction Dpi parallel to surface 12b and perpendicular to longitudinal direction $D_{Pl1}$. Length of projection 13 in longitudinal direction $D_{Pll}$ and length Pll of flat part 15 in longitudinal direction $D_{Pll}$ are longer than length Fcw of conductor 11 in width direction $D_{Fcw}$. Width directions $D_{Fcw}$ and $D_{Scw}$ are identical to longitudinal direction $D_{Pll}$. Thickness directions $D_{Fct}$ and $D_{Sct}$ are identical to each other.

A cross section of projection 13 perpendicular to longitudinal direction $D_{Pll}$ has substantially an isosceles trapezoid shape.

Conductor 11 is placed on flat part 15 of projection 13 of conductor 12. Then, welding electrodes hold and press conductors 11 and 12 from both sides of conductors 11 and 12 via projection 13, and applies a current to conductors 12 and 13. This current generates resistance heat at a portion where conductor 11 contacts projection 13. The resistance heat softens the portion where conductor 11 contacts and projection 13 while temperatures of conductors 11 and 12 are lower than both melting points of conductors 11 and 12. The pressing force from the welding electrodes allows projection 13 to be welded to conductor 11 while projection 13 is collapsed toward recess 14, thereby providing conductor assembly 16 including conductors 11 and 12 bonded to each other.

A portion conductor assembly 16 of where conductors 11 and 12 are bonded will be described with reference to FIG. 2 below. FIG. 2 is a sectional view of projection 13 in a direction perpendicular to longitudinal direction $D_{Pll}$.

As shown in FIG. 1 and FIG. 2, in the portion where conductors 11 and 12 are bonded, a portion of projection 13 placed on conductor 11 is collapsed by softening due to the resistance heat while the temperature thereof is lower than the melting point, and a pressure of the welding electrodes causes the placed portion of projection 13 to enter into and be bonded to conductor 11.

In a portion where iron materials are bonded, melted and solidified iron forms a nugget having an elliptical cross section. In resistance-welding of copper materials, however, the above nugget formed at the bonded part of iron materials is not generally formed. When copper is softened by resistance heat, the copper materials are combined just before starting to melt, so-called diffusion, to perform solid-phase diffusion bonding. In solid-phase diffusion bonding of copper materials, copper materials can be bonded from a room temperature by pressurizing force. However, with consideration to productivity of conductor assembly 16, copper is softened at about 900 to 1050° C. just before melting, thereby preferably bonding copper.

Accordingly, in conductor assembly 16 in accordance with Embodiment 1, bonded surface 17 is formed, instead of a nugget, at the portion where conductors 11 and 12 are bonded. Bonded surface 17 enters into conductor 11.

Bonded surface 17 can be confirmed by observing a cross section of conductor assembly 16 with a scanning electron microscope.

Projection 13 of conductor 12 entering into conductor 11 includes two tips 18. A portion of projection 13 between two tips 18 also enters into conductor 11. In other words, two tips 18 and the portion between two tips 18 of projection 13 enter into more inside of conductor 11 than surface 11b of conductor 11 before welding.

Downsizing of electronic devices requires conductors connecting circuits to have downsized accordingly, and requiring thin conductors to be resistor-welded.

However, copper materials have small strength, in particular, pure copper having high conductivity. For example, when a conductor becomes as thin as 0.1 to 0.3 mm, a projection tends to deform and be collapsed by the pressurizing force of electrodes for embossing projection welding. Welding with low pressurizing force is thus demanded. Accordingly, a bonding area of two conductors is reduced to provide unstable bonded surface, which can hardly provide a sufficient bonding strength.

When embossing projection welding is applied to a projection of a conductor of thin copper material having a thickness of, e.g. 0.15 mm by a technology for welding embossing projection without collapsing a smoothly-curved projection, such as a conventional conductor assembly, the strength of projection in this thin copper conductor is weak. The projection may collapse by the initial pressurization of welding electrodes before applying a current. In this case, a contact area between two conductors increases, and decreases a contact resistance. This configuration does not sufficiently large resistance heat, and thus, prevents these conductors from being bonded by welding.

If embossing projection welding is applied by reducing the pressurizing force of welding electrodes, so as not to collapse a projection made of a thin conductor, the conductors are bonded by solid-phase diffusion in which only the tip of projection is softened and attached to the surface of the other conductor. This results in an unstable bonding due to voids in the bonded surface, in addition to a reduced area for bonding the conductors. Therefore, sufficient bonding strength cannot be provided.

In contrast, in conductor assembly 16 in accordance with Embodiment 1, projection 13 of conductor 12 is softened at a temperature lower than the melting point of conductor 12, enters into an area of conductor 11, and is bonded by solid-phase diffusion by entering a part of the projection of conductor 12 into the area of conductor 11. Accordingly, the bonding area is enlarged, and fewer voids in bonded surface 17 is formed than the conductor assembly in which projection 13 of conductor 12 is attached to the surface without entering into the area of conductor 11 in solid-phase diffusion bonding. This configuration improves the bonding strength compared to the conductor assembly bonded by solid-phase diffusion in the state that projection 13 of conductor 12 is attached to the surface without entering into the area of conductor 11.

Conductor assembly 16 includes two tips 18 on projection 13 of conductor 12 entering into conductor 11. A portion of projection 13 entering conductor 11 further enlarges the bonding area of conductors 11 and 12 to increase the bonding strength, compared to a conductor assembly with a curved projection 13 entering into conductor 11 that only has a flat shape or one tip. Two tips 18 are aligned parallel to surface 12a and in lateral direction $D_{Psl}$ perpendicular to longitudinal direction $D_{Pll}$.

Based on these results, the enlarged bonding area reduces electric resistance of the portion where conductors 11 and 12 are bonded together, and suppresses electrical losses of conductor assembly 16 in an electronic device by enlarging the bonding area.

Distance Ts between two tips 18 is preferably 0.5 to 3.0 times the length Sct of conductor 12 in thickness direction $D_{Sct}$. This configuration can efficiently increase the bonding area. If distance Ts between two tips 18 is less than 0.5 times the length Sct of conductor 12, a portion between two tips 18 becomes shallow, and unpreferably reduces an effect of increasing the bonding area. If distance Ts between two tips 18 is larger than 3.0 times the length Sct of conductor 12, the contact resistance in embossing projection welding is reduced. This unpreferably results in unstable bonding state. Distance Ts between two tips 18 is more preferably 1.0 to 2.0 times the length Sct of conductor 12.

As show in FIG. 1, projection 13 of conductor 12 preferably crosses entire conductor 11 in width direction $D_{Fcw}$ and enters into conductor 11 entirely in width direction $D_{Fcw}$ of conductor 11. This configuration can suppress an electric loss by eliminating an unbalanced current flowing in a portion where conductors 11 and 12 are connected in an electronic device including the assembly for operation.

As described above, conductor assembly 16 in accordance with Embodiment 1 can improve the bonding strength by enlarging the bonding area although thin copper conductors 11 and 12 are bonded by embossing projection welding. In particular, Embodiment 1 is suitable for increasing the bonding strength of conductor assembly including conductors having thicknesses ranging from 0.1 to 0.5 mm and made of pure copper with high conductivity.

In the case that a thickness of pure copper conductor, which is length Sct in thickness direction $D_{Sct}$ is less than 0.1 mm, projection 13 is more likely collapsed. This can hardly provide the aforementioned effects, which is not preferable. In the case that the thickness is larger than 0.5 mm, projection 13 is unlikely collapsed, and conventional conductor assemblies can be used for bonding.

Conductor assembly 16 is preferable for a conductor assembly including conductors having thicknesses ranging from 0.15 to 0.30 mm made of pure copper are bonded.

Figure 3:
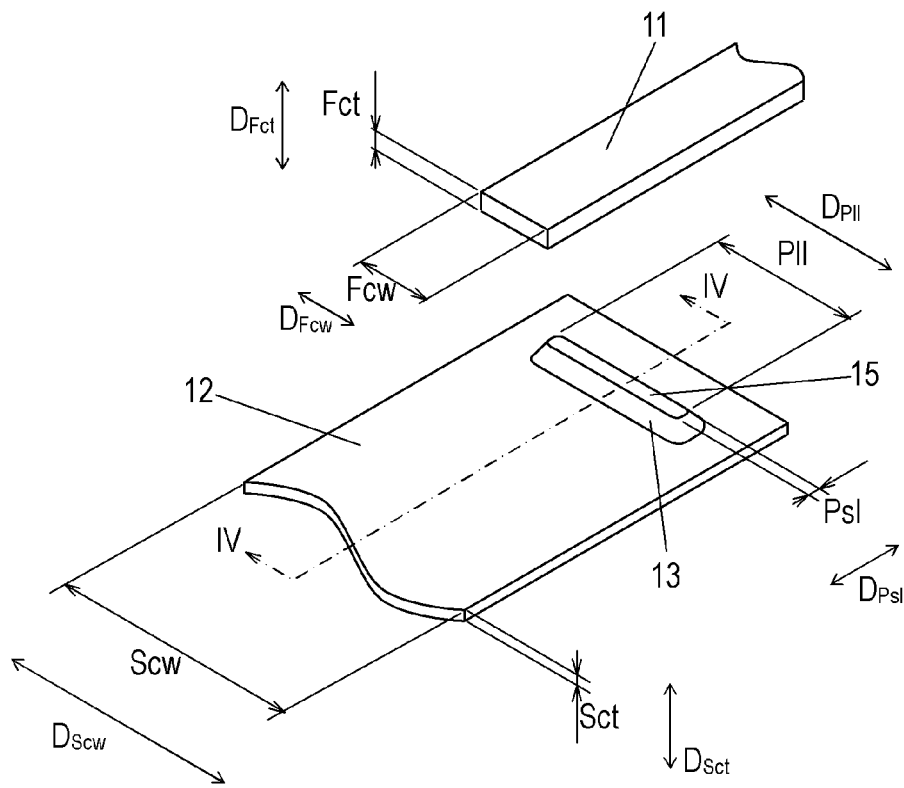
FIG. 3 is a perspective view of a conductor of the conductor assembly in accordance with Embodiment 1 before bonding.
Figure 4:
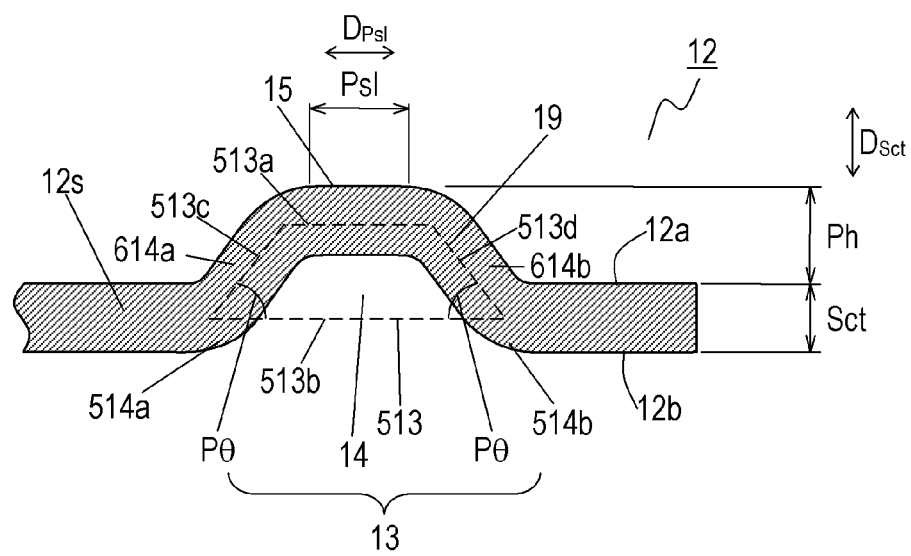
FIG. 4 is a sectional view of the conductor along line IV-IV shown in FIG. 3.
Figure 5:
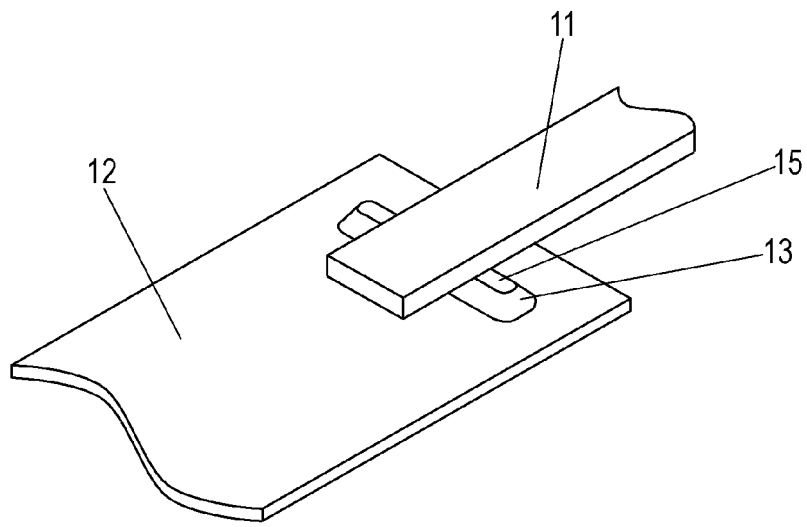
FIG. 5 is a perspective view of the conductor assembly in accordance with Embodiment 1 for illustrating a method of manufacturing the conductor assembly.
Figure 6:
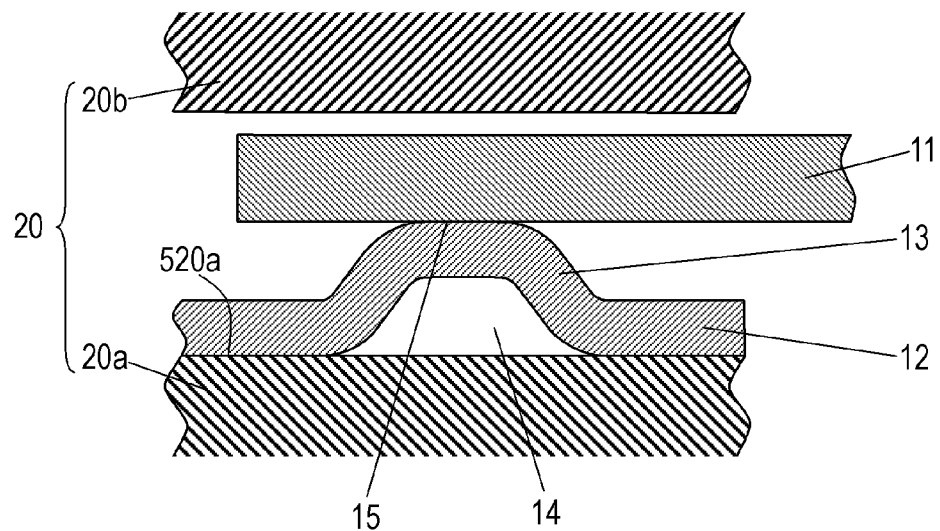
FIG. 6 is a perspective view of the conductor assembly in accordance with Embodiment 1 for illustrating the method of manufacturing the conductor assembly.
Figure 7:
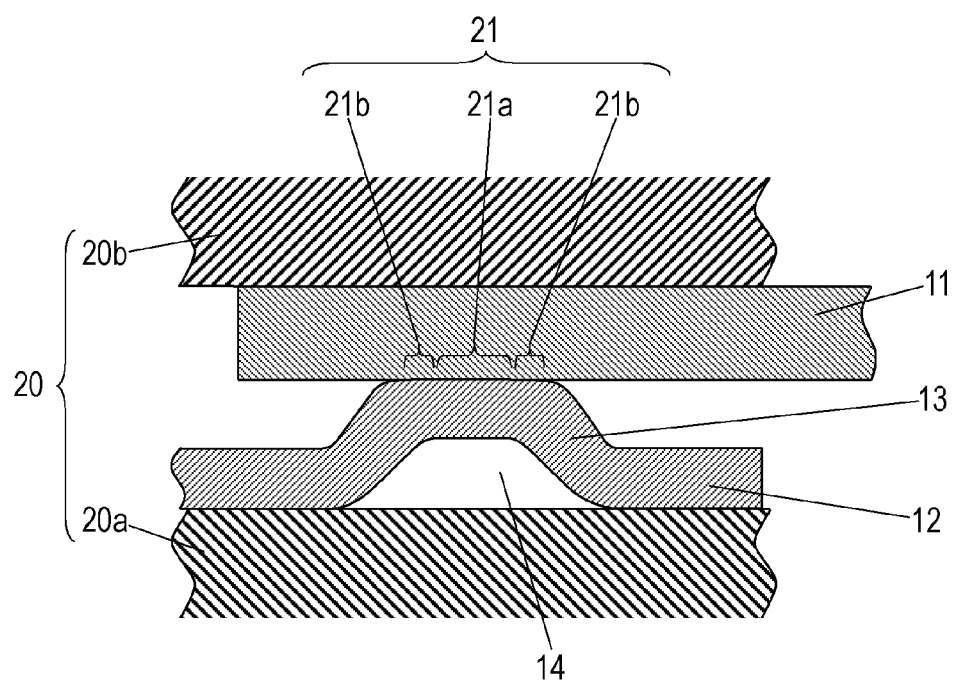
FIG. 7 is a perspective view of the conductor assembly in accordance with Embodiment 1 for illustrating the method of manufacturing the conductor assembly.
Figure 8:
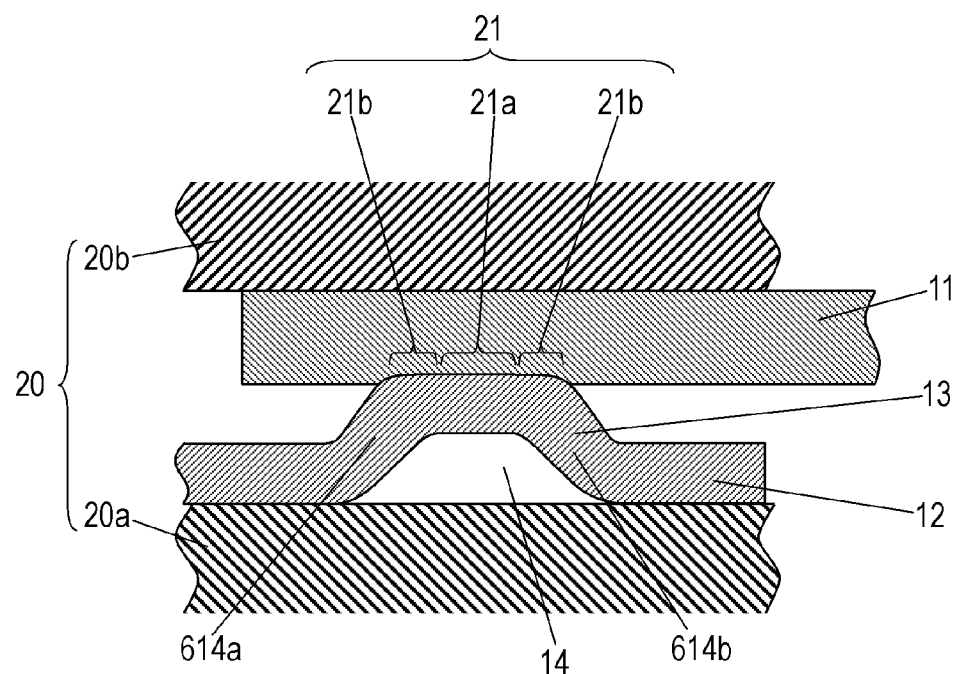
FIG. 8 is a perspective view of the conductor assembly in accordance with Embodiment 1 for illustrating the method of manufacturing the conductor assembly.

A method of manufacturing conductor assembly 16 will be described below. FIG. 3 is a perspective view of conductors 11 and 12 of conductor assembly 16 before conductors 11 and 12 are bonded. FIG. 4 is a sectional view of conductor 12 along line IV-IV shown in FIG. 3. FIG. 5 is a perspective view conductor assembly 16 for illustrating a process for manufacturing conductor assembly 16. FIGS. 6 to 8 are sectional views of conductor assembly 16 for illustrating processes for manufacturing conductor assembly 16.

As shown in FIG. 3, conductors 11 and 12 are prepared first.

Conductor 11 in accordance with Embodiment 1 is an end part of a circuit element, such as a coil element made of a metal wire typically made of pure copper wound spirally. This metal wire has a flat cross section. This metal wire may have a cross section with a shape, such as a circular shape, other than the flat shape. In this case, the end part of metal wire may be pressed to flatten a cross sectional shape. In accordance with Embodiment 1, length Fct of conductor 11 in thickness direction $D_{Fct}$ is 0.23 mm.

In accordance with Embodiment 1, conductor 12 is a metal plate made of pure copper. Length Sct of conductor 12 in thickness direction $D_{Sct}$ is 0.15 mm. Length Scw of conductor 12 in width direction $D_{Scw}$ is longer than length Few of conductor 11 in width direction $D_{Fcw}$. In accordance with Embodiment 1, as described above, conductor 12 is prepared by forming projection 13 on conductor 12 by pressing.

As shown in FIG. 4, surface 12b of the metal plate of conductor 12 is pressed surface 12b toward surface 12a opposite to surface 12b to form projection 13 projecting from embossed surface 12a. Recess 14 is formed on a back side of projection 13, i.e., surface 12b opposite to projection 13. Conductor 12 includes flat plate part 12s and projection 13 projecting from plate part 12s.

Projection 13 has flat part 15 at a tip thereof. In a direction facing surface 12a, flat part 15 has a rectangular or oval shape extending slenderly in longitudinal direction $D_{Pll}$. A length of flat part 15 in longitudinal direction $D_{Pll}$ longer than a length of flat part 15 in lateral direction $D_{Psl}$ (FIG. 3)

A cross section of projection 13 perpendicular to longitudinal direction $D_{Pll}$ substantially has isosceles trapezoid shape 513. Isosceles trapezoid shape 513 of projection 13 is formed by imaginary line 19 passing the center of the cross section perpendicular to longitudinal direction $D_{Pll}$ of projection 13. Flat part 15 constitutes upper base 513a of isosceles trapezoid shape 513 while an opening of recess 14 constitutes lower base 513b. Lower base 513b is a line connecting the center of conductor 12 at both ends 514a and 514b of the opening of recess 14. Legs 513c and 513d of isosceles trapezoid shape 513 are constituted by parts 614a and 614b rising from ends 514a and 514b of the opening in conductor 12 and connected to flat part 15.

Internal angle Pθ at both ends of lower base 513b of projection 13 in isosceles trapezoid shape 513, i.e., an angle formed by part 614a of conductor 12 at projection 13 and lower base 513b, is an acute angle ranging from 45° to 70°. In accordance with Embodiment 1, internal angle Pθ is 55°.

In accordance with Embodiment 1, length Psl of projection 13 in lateral direction $D_{Psl}$, which is a length of flat part 15 corresponding to upper base 513a of isosceles trapezoid shape 513 is 0.5 to 3.0 times the length Sct of conductor 12 in thickness direction $D_{Sct}$. If length Psl of projection 13 in lateral direction $D_{Psl}$ is shorter than 0.5 times the length Sct of conductor 12 in thickness direction $D_{Sct}$, distance Ts between two tips 18 is narrow to cause a portion between two tips 18 to be excessively shallow. This unpreferably reduces the effect of increasing the bonding area. If length Psl of projection 13 is longer than 3.0 times the length Sct of conductor 12, an area of flat part 15 is enlarged to reduce a contact resistance in embossing projection welding. This makes the bonding state unstable, which is not preferable.

Height Ph of projection 13 of conductor 12 projecting in thickness direction $D_{Sct}$ 12 is not smaller than length Sct of conductor 12 in thickness direction $D_{Sct}$, and smaller than length Fct of conductor 11 in thickness direction $D_{Fct}$.

Height Ph of projection 13 is preferably equal to or longer than length Sct of conductor 12 so that projection 13 can easily enter into the area of conductor 11 in embossing projection welding. In accordance with Embodiment 1, height Ph of projection 13 is 1.3 times the length Sct of conductor 12.

Height Ph of projection 13 is preferably smaller than length Fct of conductor 11 so that a welding electrode which pressing conductor 11 cannot contact projection 13.

As shown in FIG. 5, conductor 11 overlaps conductor 12 such that conductor 11 contacts flat part 15 of projection 13. Longitudinal direction $D_{Pll}$ of projection 13 preferably crosses conductor 11 extending perpendicularly to directions $D_{Fct}$ and $D_{Fcw}$. Length Pll of projection 13 in longitudinal direction $D_{Pll}$ is preferably longer than length Few of conductor 11 in width direction $D_{Fcw}$.

This configuration allows conductors 11 and 12 to be easily positioned, and form an area where conductor 12 enters into conductor 11 entirely in width direction $D_{Fcw}$.

Conductors 11 and 12 overlapping each other are tentatively fixed with a jig to avoid a positional deviation.

Next, as shown in FIG. 6, conductors 11 and 12 overlapping each other are placed on welding electrode 20 (20a and 20b) of a welding device.

Welding electrode 20 includes fixed welding electrode 20a attached to a fixed welding head of the welding device, and movable welding electrode 20b attached to a movable welding head of the welding device. Movable welding electrode 20b moves toward fixed welding electrode 20a to pressurize conductors 11 and 12 placed between welding electrodes 20a and 20b to sandwich conductors 11 and 12.

Fixed welding electrode 20a has flat surface 520a at a tip thereof. Conductor 12 is placed on surface 520a. Movable welding electrode 20b has a flat surface at a tip thereof shown in FIG. 6, but may have a slightly convex surface. In the case that the tip surface is convex, conductors 11 and 12 are positioned with respect to movable welding electrode 20b to ensure that the tip of the convex shape faces projection 13 across conductor 11.

FIGS. 6 to 9 are sectional views of conductors 11 and 12 shown in FIG. 4, for mainly showing projection 13 and showing cross sections of conductors 11 and 12 and welding electrode 20.

Next, as shown in FIG. 7, movable welding electrode 20b moves relatively toward fixed welding electrode 20a to apply a pressure to conductors 11 and 12 while sandwiching conductors 11 and 12. While a current is not applied between welding electrodes 20a and 20b, projection 13 is pressed until height Ph of projection 13 decreases to about 70% to 80% of the original height thereof before the pressing by this initial pressurization.

Since internal angle Pθ formed by parts 614a and 614b of conductor 12 at projection 13 and lower base 513b of isosceles trapezoid shape 513 is 55°, parts 614a and 614b of projection 13 of conductor 12 receive the initial pressure from by movable welding electrode 20b to prevent projection 13 from being largely collapsed. Accordingly, a larger pressuring force can be applied, compared to a smoothly-curved protrusion of the conventional conductor assembly.

Since length Pll of projection 13 in longitudinal direction $D_{Pll}$ is longer than length Few of conductor 11 in width direction $D_{Fcw}$, projection 13 has a portion not overlap conductor 11. This configuration prevents projection 13 from being heavily collapsed.

In a comparative example of a conductor assembly with smoothly-curved protrusion, an area where the conductors contact drastically changes due to a slight collapse of a curved portion at the tip. This drastically changes a contact resistance between the conductors. While a current is applied between the welding electrodes, the contact resistance increases if the collapse at the tip of protrusion is small. This causes rapid melting, and melted conductor may be spattered. In the comparative example of the conductor assembly, the contact resistance decreases if the tip of the projection is heavily collapsed. In this case, no resistance heat is generated, and causes the bonding of conductors to be unstable.

In contrast, in conductor assembly 16 in accordance with Embodiment 1, projection 13 has a cross section having substantially an isosceles shape that does not collapse easily. Therefore, although height Ph of projection 13 is pressed to the height of about 70% to 80% of the original height before the pressing, a large change of contact area between conductors 11 and 12 can be suppressed. Large pressurizing force and contact area with less change provide a stable contact resistance between conductors 11 and 12. This allows the applied current to be determined easily, and provides stable bonding.

Next, as shown in FIG. 8, a current is applied between welding electrodes 20a and 20b to generate resistance heat at a portion where conductor 11 contacts conductor 121.

After the initial pressure is applied by welding electrode 20, a contact resistance at both sides 21b of contact area 21 where conductor 11 contacts conductor 12 increases, compared to center 21a of contact area 21. Both sides 21b of contact area 21 are contact portions where projection 13 extends at the initial pressurization by welding electrode 20. The contact resistances of the contact portions are high since the applied pressure is smaller than the pressure applied to center 21 of contact area 21.

Therefore, at the initial stage of starting applying the current after the initial pressure is applied with welding electrode 20, a current concentrates on center 21a of contact area 21 having a small contact resistance, hence generating a resistance heat.

Since copper has a positive temperature coefficient of resistance, the resistance of center 21a of contact 21 increases as the generated resistance heat increases. Then, a portion where the current concentrates spreads toward both sides 21b of contact area 21, and hence, the resistance heat increases.

Entire contact area 21 is softened by the resistance heat at a temperature around 900° C. to 1050° C., which is lower than the melting point of conductors 11 and 12. With further pressurization by welding electrodes 20a and 20b, center 21a and both sides 21b of contact area 21, which are a part of projection 13 of conductor 12, enter into the area of conductor 11.

In bonded surface 17 of conductor assembly 16, a valley portion between two tips 18 enters the area of conductor 11.

Figure 9:
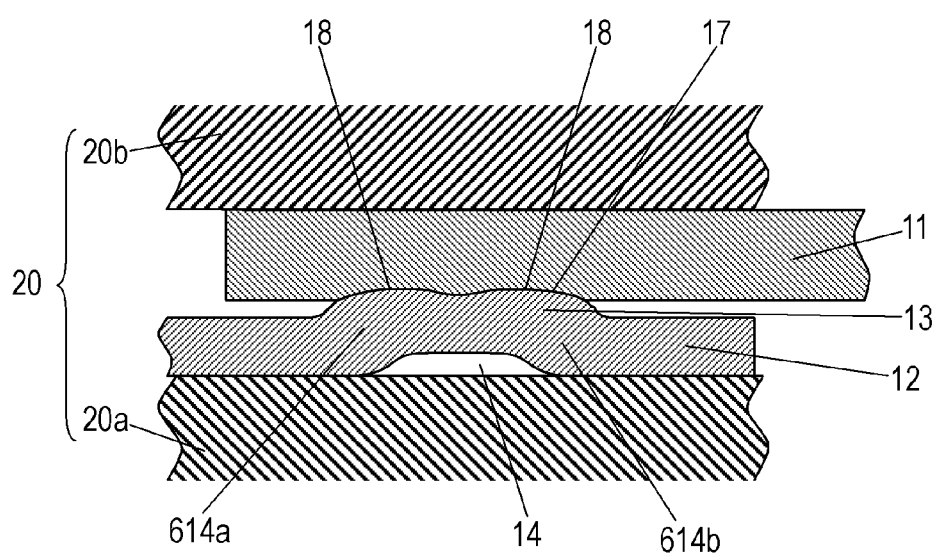
FIG. 9 is a perspective view of the conductor assembly in accordance with Embodiment 1 for illustrating the method of manufacturing the conductor assembly.

As shown in FIG. 9, when a part of projection 13 of conductor 12 enters into the area of conductor 11, conductor 11 further contacts projection 13 of conductor 12 at a portion of contact area 21 continuing outward from both sides 21b of contact area 21. Similarly, a part of projection 13 of conductor 12 enters into the area of conductor 11 as resistance heat is generated and softening occurs at a temperature lower than the melting point.

Since a rising angle (internal angle Pθ) of parts 614a and 614b connected to plate part 12s and flat part 15 of projection 13 of conductor 12 is 55°, projection 13 does not suddenly soften and collapse entirely due to the pressurizing force applied by welding electrode 20. In addition, conductors 11 and 12 can easily contact at a peripheral portion of both sides 21b of contact area 21.

Accordingly, internal angle Pθ at both ends of lower base 513b of isosceles trapezoid shape 513 of projection 13, i.e., a rising angle of parts 614a and 614b connected to plate part 12s and flat part 15 of projection 13 of conductor 12, preferably ranges from 45° to 70°. In the case that internal angle Pθ is smaller than 45°, entire projection 13 is easily collapsed unpreferably. Internal angle Pθ larger than 70° unpreferably prevents new contact between conductors 11 and 12 outside both sides 21b of contact area 21. Internal angle Pθ more preferably ranges from 50° to 65°.

At portions of conductors 11 and 12 newly contact outside contact area 21 of projection 13, a portion not softened in parts 614a and 614b connected to plate part 12s and flat part 15 of projection 13 of conductor 12 transfers the pressurizing force of welding electrode 20 to the softened portion of parts 614a and 614b, and pushes the softened portion into conductor 11. This achieves bonded surface 17 with two tips 18 while center 21a of contact area 21 in between, as shown in FIG. 9.

Embossing projection welding can be completed by reduced the resistance heat due to enlarged contact area 21, or by controlling a movement of welding electrode 20 (20b), thereby providing conductor assembly 16 shown in FIG. 1.

The pressurizing force and the current between welding electrodes 20a and 20b may be controlled to change according to the softening state of conductors 11 and 13 of conductor 12. This configuration allows the height of two tips 18 to be adjusted.

Conductor assembly 16 in accordance with Embodiment 1 can improve the bonding strength by increased the bonding area even if thin copper conductors are bonded by embossing projection welding.

Exemplary Embodiment 2

Figure 10:
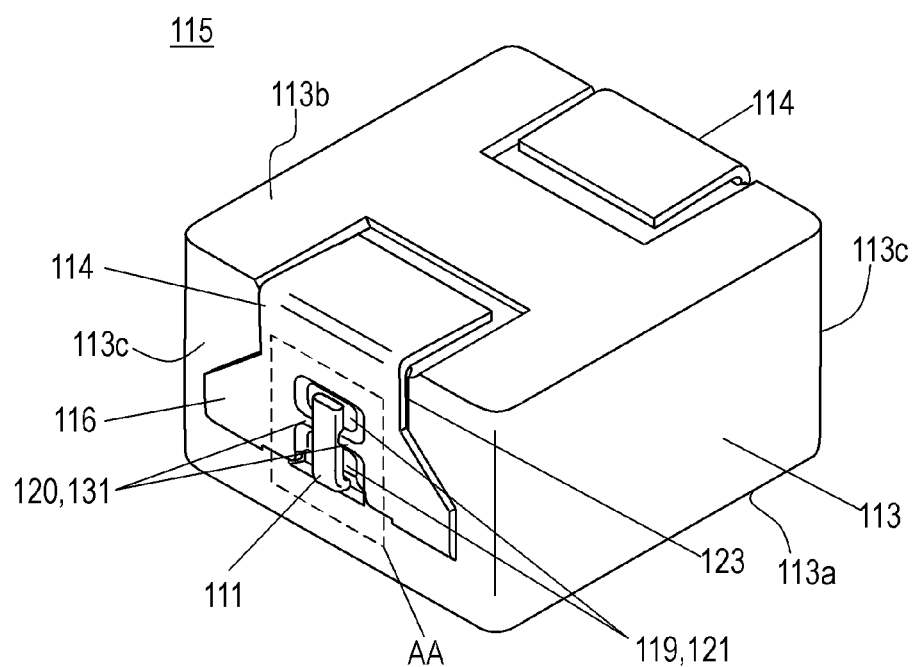
FIG. 10 is a bottom perspective view of an electronic component in accordance with Exemplary Embodiment 2.
Figure 11:
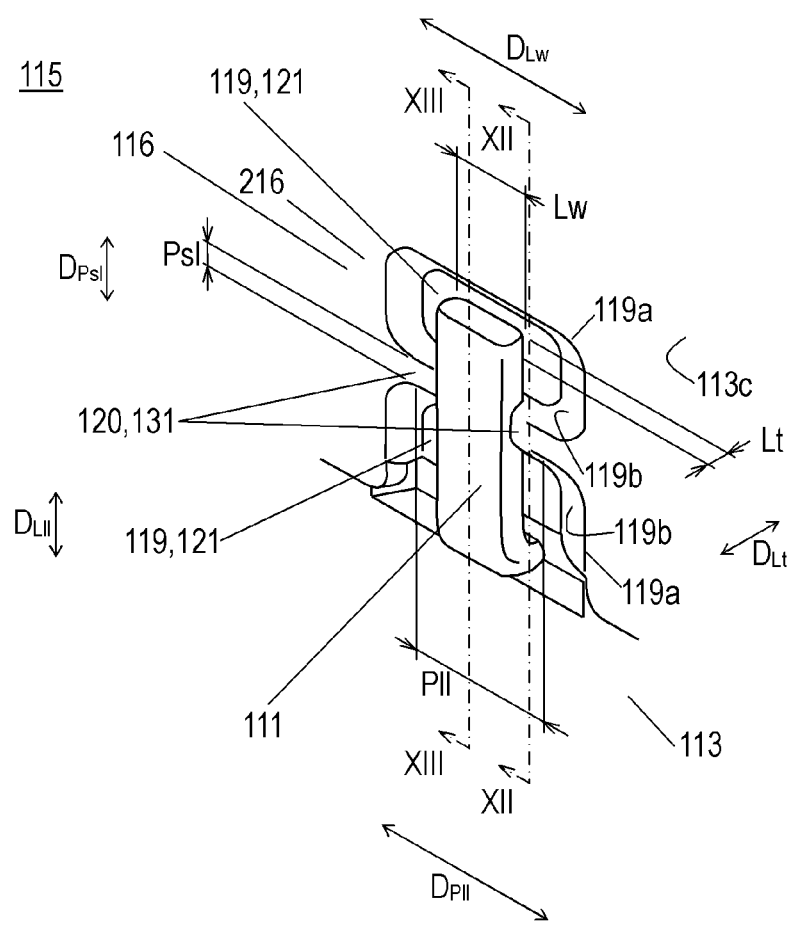
FIG. 11 is a partially enlarged view of the electronic component shown in FIG. 10.
Figure 12:
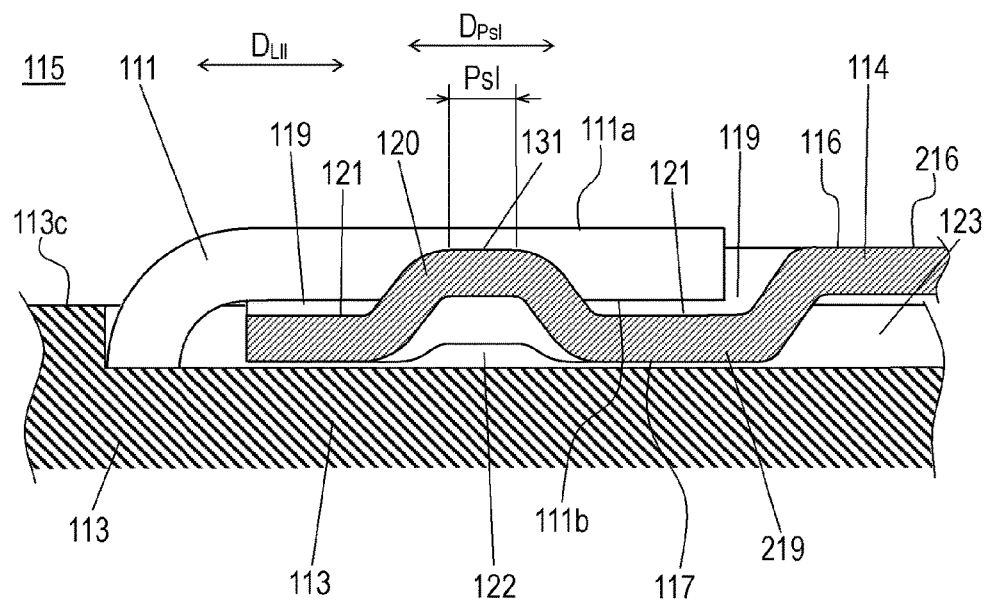
FIG. 12 is a sectional view of the electronic component along line XII-XII shown in FIG. 11.
Figure 13:
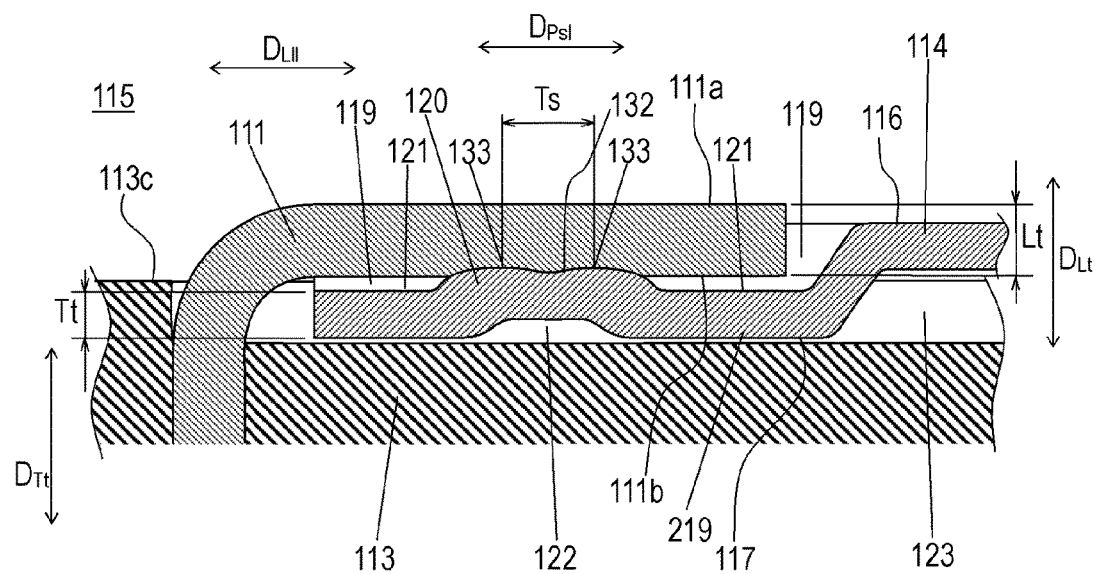
FIG. 13 is a sectional view of the electronic component along line XIII-XIII shown in FIG. 12.

FIG. 10 is a bottom perspective view of electronic component 115 in accordance with Exemplary Embodiment 2. FIG. 11 is a partial enlarged view of a part AA of electronic component 115 shown in FIG. 10. FIG. 12 is a sectional view of electronic component 115 along line XII-XII shown in FIG. 11. FIG. 13 is a sectional view of electronic component 115 along line XIII-XIII shown in FIG. 11.

Electronic component 115 includes circuit element 112 including lead-out conductor 111, body 113 accommodating circuit element 112 therein, and terminal conductor 114 connected to lead-out conductor 111. In electronic component 115 in accordance with Embodiment 2, circuit element 112 is a coil. Body 113 has substantially a rectangular column shape having upper surface 113a, lower surface 113b, and side surfaces 113c connected to upper surface 113a and lower surface 113b. Terminal conductor 114 is made of a metal plate, and has surface 116 and surface 117 opposite to surface 116.

Body 113 is made of resin and magnetic metal powder mainly containing iron dispersed in resin. A binder made of thermosetting resin, such as epoxy resin, is mixed with the magnetic metal powder to prepare magnetic granule. This magnetic granule is placed in a mold, and circuit element 112 and one end of terminal conductor 114 are embedded in the granule in the mold to be press-molded. Heat is applied to cure the thermosetting resin to prepare body 113 accommodating one end of terminal conductor 114 embedded therein. The embedded one end of terminal conductor 114 is fixed to side surface 113c of body 113.

Lead-out conductor 111 of circuit element 112 overlaps terminal conductor 114, and is resistance-welded. The other end of terminal conductor 114 disposed outside body 113 is bent along lower surface 113b from side surface 113c of body 113. In accordance with Embodiment 2, body 113 has outer dimensions of 7.0 mm×7.5 mm×5.0 mm. Electronic component 115 is a surface-mounting electronic component.

In accordance with Embodiment 2, circuit element 112 is a coil made of an insulated conductive wire helically wound.

In accordance with Embodiment 2, the insulated conductive wire includes a metal wire and an insulated coating covering the metal wire. The metal wire is made of pure copper having a diameter of 0.30 mm having a circular cross section. Both ends of the insulated conductive wire are led out in directions opposite to each other to constitute lead-out conductors 111. A portion of the insulated coating at lead-out conductor 111 is removed, and lead-out conductor 111 is pressed to have a flat shape. Lead-out conductor 111 has surface 111a and surface 111b opposite to surface 111a.

The flat shape of lead-out conductor reduces the thickness together with terminal conductor 114 after terminal conductor 114 is resistance-welded. In the case that the metal wire has a cross section having a flat shape, the pressing process to have the flat shape is not required.

In accordance with Embodiment 2, length Lt of lead-out conductor 111 in thickness direction $D_{Lt}$ is 0.23 mm Surface 111b parallel to width direction $D_{Lw}$ perpendicular to thickness direction $D_{Lt}$ of lead-out conductor 111 is welded onto terminal conductor 114. Lead-out conductor 111 extends slenderly in direction $D_{Ll}$ perpendicular to thickness direction $D_{Lt}$ and width direction $D_{Lw}$.

Terminal conductor 114 is formed by pressing a metal plate. In accordance with Embodiment 2, terminal conductor 114 is made of pure copper. Length Tt of terminal conductor 114 in thickness direction $D_{Tt}$ is 0.15 mm. Length Tt of terminal conductor 114 in width direction $DL_{Lw}$ is longer than length Lw of lead-out conductor 111 in width direction $D_{Lw}$. Lead-out conductor 111 is placed on terminal conductor 114 and resistance-welded to connect terminal conductor 114 and circuit element 112.

Before resistance-welding lead-out conductor 111 to terminal conductor 114, plural recesses 119 are provided in an area including a portion where terminal conductor 114 is placed on lead-out conductor 111 of circuit element 112. Recesses 119 are formed by pressing terminal conductor 114 to emboss surface 116 placed on lead-out conductor 111 toward surface 117 opposite to surface 116. Each recess 119 has a depth of 0.18 mm from outer periphery 119a surrounding recess 119 in terminal conductor 114, and has bottom surface 121. Outer periphery 119a is located in flat portion 216 of surface 116. Plural recesses 119 are arranged in direction $D_{Ll}$ in which lead-out conductor 111 extends slenderly. Respective portions of recesses 119 adjacent to each other are parallel to each other. Each recess 119 further has inner wall 119b extending from outer periphery 119a to bottom surface 121. Surface 116 of terminal conductor 114 includes flat portion 216, inner walls 119b of recesses 119, and bottom surface 121 of recesses 119.

Terminal conductor 114 includes plural protrusions 219 projecting from surface 117 at positions opposite to recesses 119. Housing groove 123 housing protrusions 219 is provided in side surface 113c of body 113. Housing protrusions 219 housed in housing groove 123 suppress an increase of outer dimensions of electronic component 115.

Terminal conductor 114 includes projection 120 locally projecting from surface 116 between bottom surfaces 121 of recesses 119. Inner walls 119b of recesses 119 adjacent to each other constitute projection 120. Projection 120 extends linearly in longitudinal direction $D_{Pll}$ crossing lead-out conductor 111. Recess 122 is formed in surface 117 opposite to projection 120.

A tip of projection 120 is flush with flat portion 216 of surface 116 of terminal conductor 114, and has flat part 131 surrounded by two sides extending in longitudinal direction $D_{Pll}$ and two sides extending in lateral direction $D_{Psl}$.

The two sides of flat part 131 of projection 120 extending in longitudinal direction $D_{Pll}$ are parts of recesses 119 which are adjacent to each other and extend parallel to each other, and lengths of the two sides extending in lateral direction $D_{Psl}$ are a distance between the parts of adjacent recesses 119 parallel to each other.

Length Pll of projection 120 in longitudinal direction $D_{Pll}$ is longer than length Lw of lead-out conductor 111 in width direction $D_{Lw}$. Similarly to projection 13 of conductor assembly 16 in accordance with Embodiment 1 shown in FIG. 2, a cross section of projection 120 perpendicular to longitudinal direction $D_{Pll}$ has an isosceles trapezoid shape in electronic component 115 shown in FIG. 12.

Projection 120 configures an embossed projection in resistance-welding.

A portion of lead-out conductor 111 to be welded is placed on flat part 131 of projection 120 of terminal conductor 114. Then, a current is applied to lead-out conductor 111 and terminal conductor 114 while lead-out conductor 111 and terminal conductor 114 are pressurized via projection 120 from both sides by the welding electrodes. The current generates resistance heat at a portion where lead-out conductor 111 contacts projection 120. The resistance heat softens the contact portion of lead-out conductor 111 and projection 120 at a temperature lower than the melting points of lead-out conductor 111 and projection 120. Projection 120 is collapsed toward recess 122 by the pressurizing force of the welding electrodes while lead-out conductor 111 sinks in recess 119. Accordingly, lead-out conductor 111 is welded while lead-out conductor 111 sinks into projection 120. Lead-out conductor 111 is thus connected to terminal conductor 114 by embossing projection welding.

A bonded part after resistance-welding of lead-out conductor 111 and projection 120 of terminal conductor 114 by embossing projection welding will be described below with reference to FIGS. 12 and 13. FIG. 12 shows a cross section perpendicular to longitudinal direction $D_{Pll}$ of a portion where lead-out conductor 111 is not placed on projection 12. FIG. 13 shows a cross section perpendicular to longitudinal direction $D_{Pll}$ of a portion where lead-out conductor 111 is placed on and bonded to protrusion 120.

Different from FIG. 10, body 113 is illustrated at the lower surface of body 13 upward in FIG. 12 and FIG. 13.

As shown in FIG. 12 and FIG. 13, in the portion where lead-out conductor 111 is bonded to terminal conductor 114, a portion of projection 120 placed on lead-out conductor 111 is collapsed and lead-out conductor 111 sinks into projection 120 by softening projection 120 and lead-out conductor 111 due to resistance heat at a temperature lower than the melting point and by pressuring force of the welding electrodes. A collapsed portion of projection 120 enters the area of lead-out conductor 111, and is bonded to lead-out conductor 111.

At a portion where iron materials are bonded, iron melts and solidifies to form a nugget having a cross section having an elliptical shape. In resistance-welding of a copper material to a copper material, such a nugget formed at a bonded part of iron materials is not formed. When copper is softened by resistance heat, copper materials are combined just before starting to melt, so-called diffusion, to perform sold-phase diffusion bonding. In solid-phase diffusion bonding of copper materials, the copper materials can be bonded from a room temperature by a pressurizing force. However, in view of productivity of conductor assemblies, copper is softened at about 900 to 1050° C. just before melting, so as to perform preferable copper bonding.

In electronic component 115 in accordance with Embodiment 2, bonded surface 132 is formed, instead of a nugget, at the portion where lead-out conductor 111 is bonded to terminal conductor 114. Bonded surface 132 enters into the area of lead-out conductor 111.

Bonded surface 132 can be confirmed by observing, with a scanning electron microscope, a cross section of the portion where lead-out conductor 111 is bonded to projection 120.

Projection 120 of terminal conductor 114 entering into lead-out conductor 111 includes two tips 133. A portion of terminal conductor 114 between two tips 133 also enters into lead-out conductor 111.

In order to provide electronic devices with small sizes, conductors connecting circuits have small sizes accordingly, and thus resistance-welding is demanded for thin conductors. Resistance-welding is demanded for connecting a lead-out conductor to terminal conductor of a circuit element in an electronic component mounted in an electronic device, in addition to bus bars for connecting circuits. For example, in small power components, such as a choke coil, in electronic devices, such as a DC-DC converter, a copper material with high conductivity is used for a terminal conductor in order to reduce power, and resistance-welding is required for a lead-out conductor of a wound copper wire and a terminal conductor.

However, a copper material, particularly pure copper, with high conductivity has low strength. For example, in a choke coil, a copper sheet used for the terminal conductor is thin and has a thickness ranging from 0.1 to 0.3 mm, and thus the projection tends to deform and collapse by the pressurizing force of electrodes of embossing projection welding. Welding at low pressurizing force is thus required. This reduces the bonding area of two conductors: the lead-out conductor of electronic component and the terminal conductor. The bonded surface becomes unstable, and thus cannot provide sufficient bonding strength.

When embossing projection welding technology for avoiding collapse of smoothly-curved projection in a conventional electronic component is used for a thin copper material having a thickness of 0.15 mm with a projection, the projection collapses by the initial pressurization of the welding electrodes before applying a current since the projection of thin copper conductor has low strength. This configuration increases the contact area of two conductors and reduces contact resistance. This configuration generates little resistance heat, and thus, cannot weld and bond these conductors.

When the pressurizing force of the welding electrodes is reduced to achieve embossing projection welding without collapsing a protrusion formed on a thin conductor, only the tip of the projection is softened and attached onto the surface of the other conductor in solid-phase diffusion for bonding the conductor. This tends to create void in bonded surface 132, in addition to a small bonding area. The bonding state thus becomes unstable and prevents sufficient bonding strength.

In contrast, in electronic component 115 in accordance with Embodiment 2, a part of projection 120 of terminal conductor 114 enters into lead-out conductor 111. Projection 120 of terminal conductor 114 is softened at a temperature lower than the melting point, and enters into and is bonded onto lead-out conductor 111 by solid-phase diffusion. This configuration prevents bonded surface 132 from having voids formed therein in addition to increase the bonding area, compared to the electronic component bonded by solid-phase diffusion of being attached only to the surface without projection 120 of terminal conductor 114 entering into lead-out conductor 111. The bonding strength can thus be improved.

Electronic component 115 in which projection 120 of terminal conductor 114 entering into lead-out conductor 111 has two tips 133 increases the bonding area to increase the bonding strength, compared to an electronic component having a terminal conductor with a flat surface or a curved surface with only one tip.

Based on these results, the bonding area is increased, and accordingly reduces electric resistance at the portion where lead-out conductor 111 is bonded to terminal conductor 114, hence suppressing an electric loss at the portion where lead-out conductor 111 is bonded to terminal conductor 114.

Distance Ts between two tips 133 is preferably 0.5 to 3.0 times the length Tt of terminal conductor 114 in thickness direction $D_{Tt}$. This configuration efficiently increases the bonding area.

If distance Ts between two tips 133 is smaller than 0.5 times the length Tt of terminal conductor 114 in thickness direction $D_{Tt}$, distance Ts between two tips 133 is narrow, and causes a portion between two tips 133 to be excessively shallow, thus unpreferably reducing the effect of increasing the bonding area. If distance Ts between two tips 133 is larger than 3.0 times the length Tt of terminal conductor 114 in thickness direction $D_{Tt}$, contact resistance in embossing projection welding reduces. The bonding state then unpreferably becomes unstable. Distance Ts between two tips 133 is more preferably 1.0 to 2.0 times the length Tt of terminal conductor 114 in thickness direction $D_{Tt}$.

As shown in FIG. 10 and FIG. 11, projection 120 of terminal conductor 114 preferably crosses lead-out conductor 111 entirely in width direction $D_{Lw}$ so that terminal conductor 114 can enters into lead-out conductor 111 entirely in width direction $D_{Lw}$. Electronic component 115 installed into an electronic device for operation eliminates a local distribution of a current flowing in the portion where lead-out conductor 111 is connected to terminal conductor 114, accordingly suppressing an electric loss.

In electronic component 115 in accordance with Embodiment 2, surface 116 of terminal conductor 114 placed on lead-out conductor 111 faces the opposite side of body 113 while surface 117 faces body 113. However, surface 116 of terminal conductor 114 may face surface body 113. This configuration allows lead-out conductor 111 to be surrounded by body 113 and terminal conductor 114, and suppresses damage or disconnection of lead-out conductor 111 due to an external mechanical stress.

As described above, in electronic component 115 in accordance with Embodiment 2, the bonding area can be enlarged to increase the bonding strength even though thin copper lead-out conductor 111 of circuit element 112 is bonded to thin copper terminal conductor 114 by embossing projection welding. The component according to Embodiment 2 is suitable particularly for increasing the bonding strength of conductors made of highly-conductive pure copper with thicknesses ranging from 0.1 to 0.5 mm. Lead-out conductor 111 and terminal conductor 114 both made of pure copper with thicknesses smaller than 0.1 mm is not preferable since projection 120 further tends to collapse and aforementioned effect is difficult to be achieved. Lead-out conductor 111 and terminal conductor 114 both made of pure copper with thicknesses larger than 0.5 mm can be bonded by the conventional technology for electronic components since projection 120 can hardly collapse.

Embodiment 2 is more suitable for bonding lead-out conductor 111 and terminal conductor 114 both made of pure copper with thicknesses ranging from 0.15 to 0.30 mm.

Figure 14:
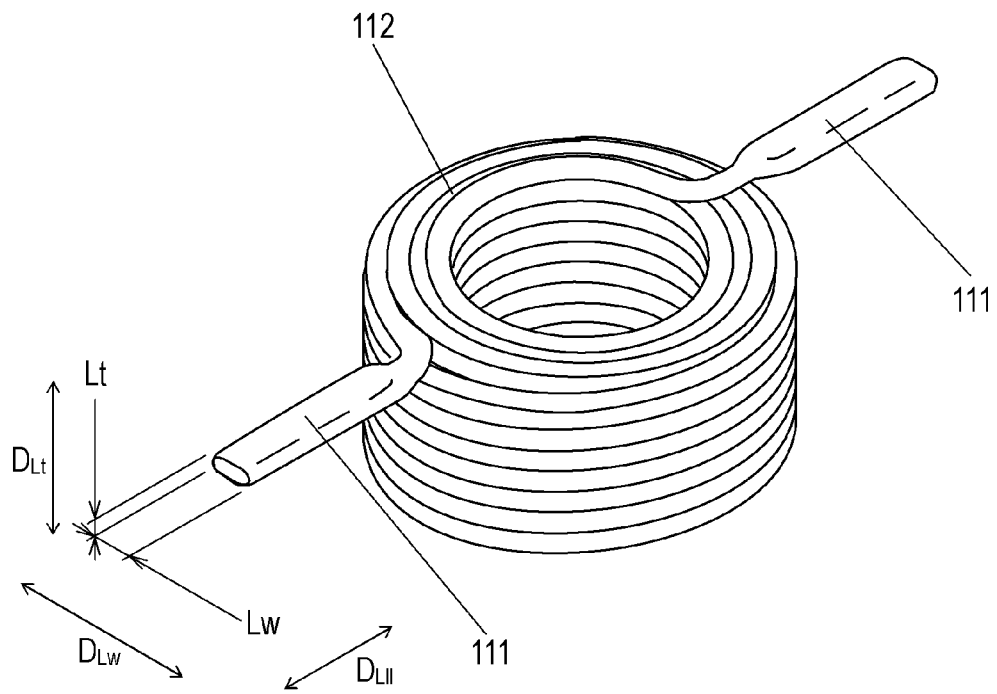
FIG. 14 is a perspective view of the electronic component in accordance with Embodiment 2 for illustrating a method of manufacturing the electronic component.
Figure 15:
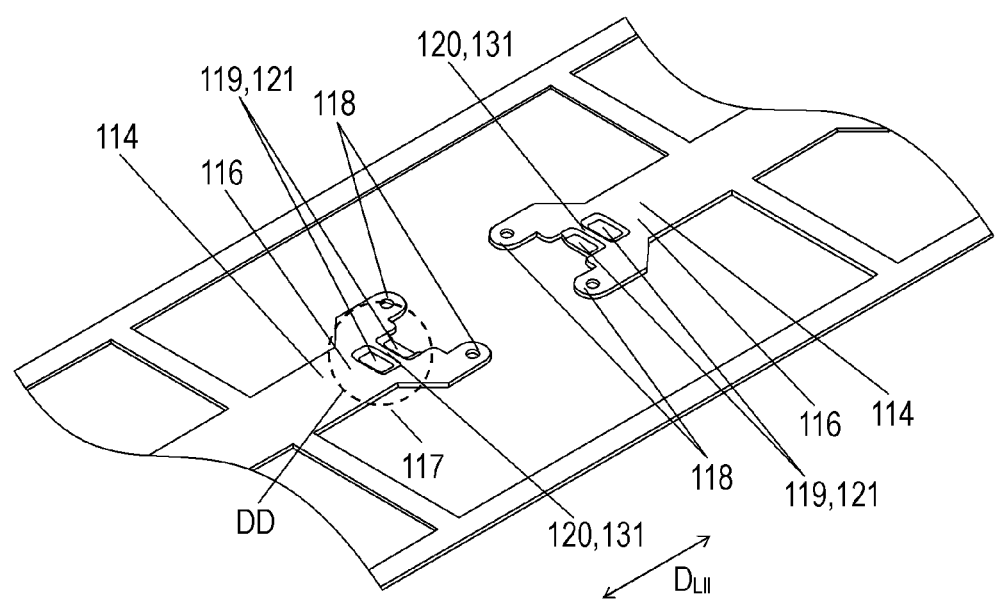
FIG. 15 is a perspective view of the electronic component in accordance with Embodiment 2 for illustrating the method of manufacturing the electronic component.
Figure 16:
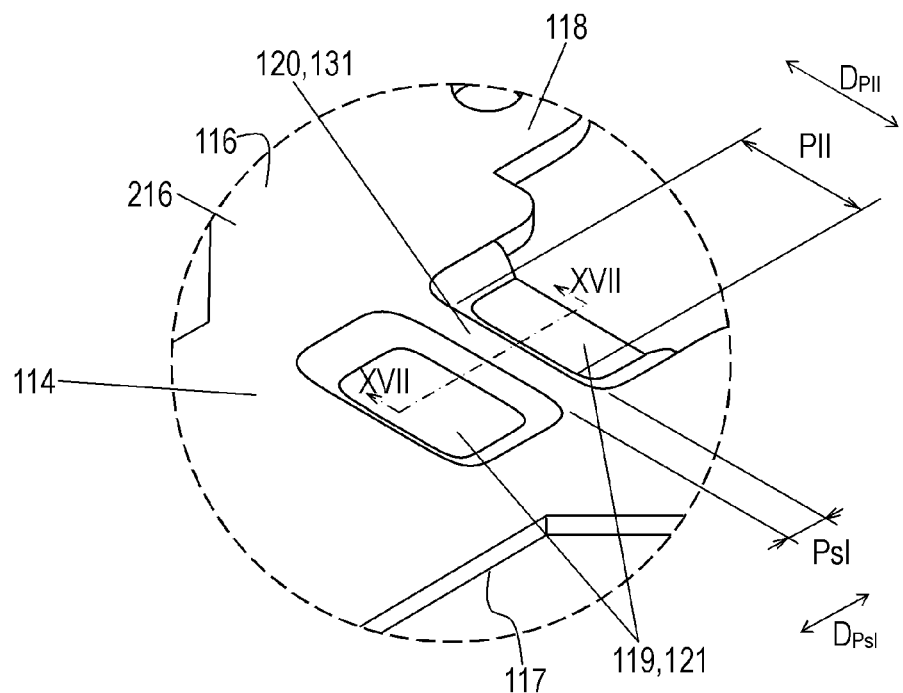
FIG. 16 is a partial enlarged view of the electronic component shown in FIG. 15.
Figure 17:
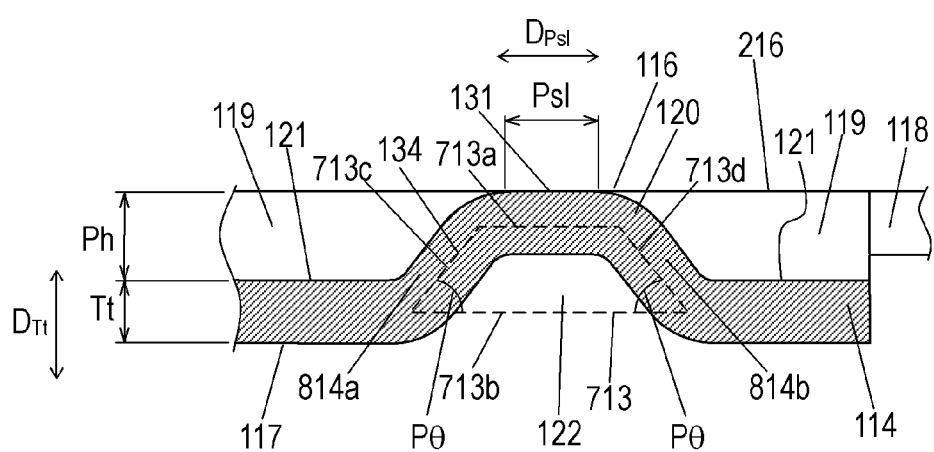
FIG. 17 is a sectional view of the electronic component along line XVII-XVII shown in FIG. 16.
Figure 18:
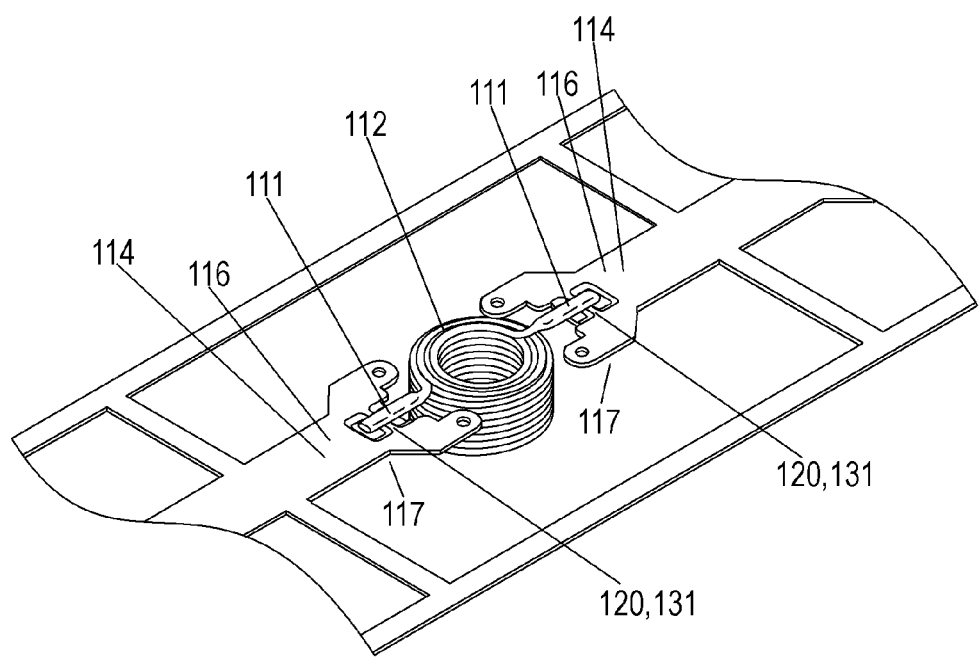
FIG. 18 is a perspective view of the electronic component in accordance with Embodiment 2 for illustrating the method of manufacturing the electronic component.
Figure 23:
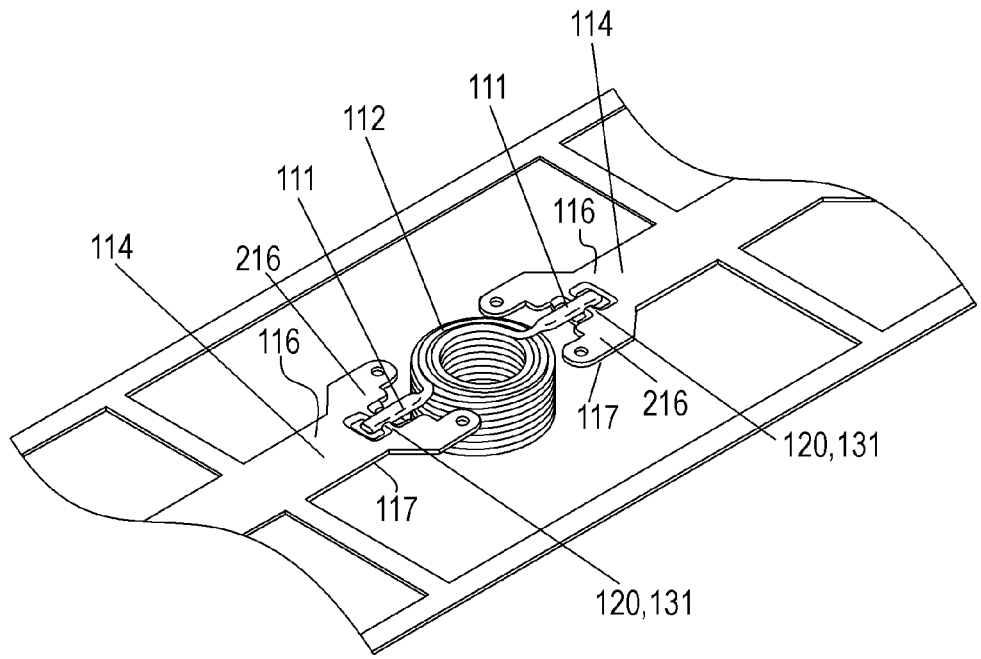
FIG. 23 is a perspective view of the electronic component in accordance with Embodiment 2 for illustrating the method of manufacturing the electronic component.
Figure 24:
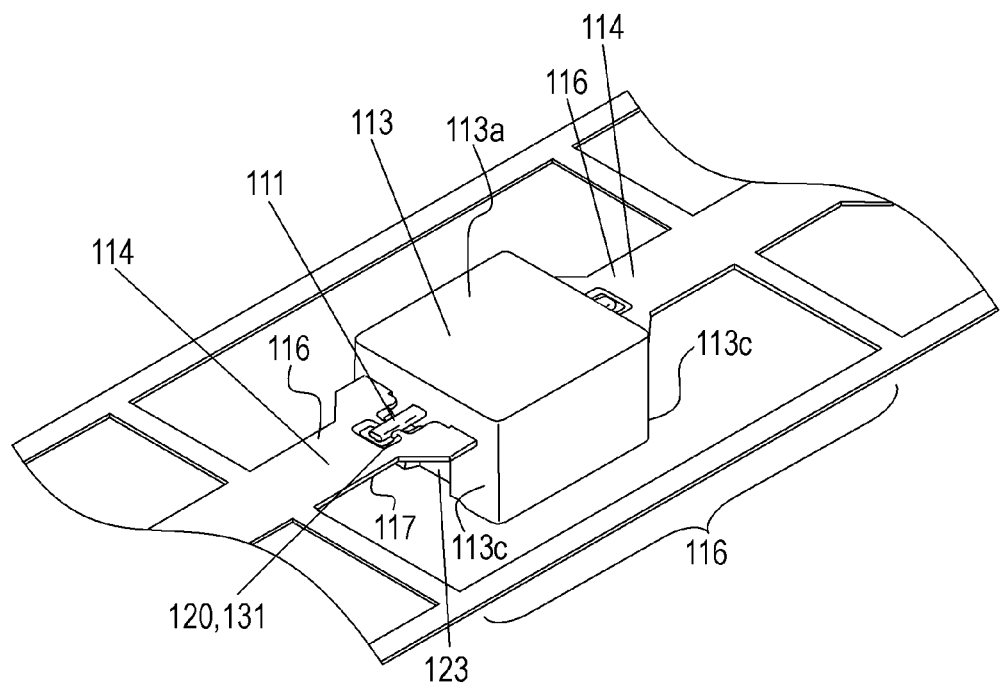
FIG. 24 is a perspective view of the electronic component in accordance with Embodiment 2 for illustrating the method of manufacturing the electronic component.
Figure 25:
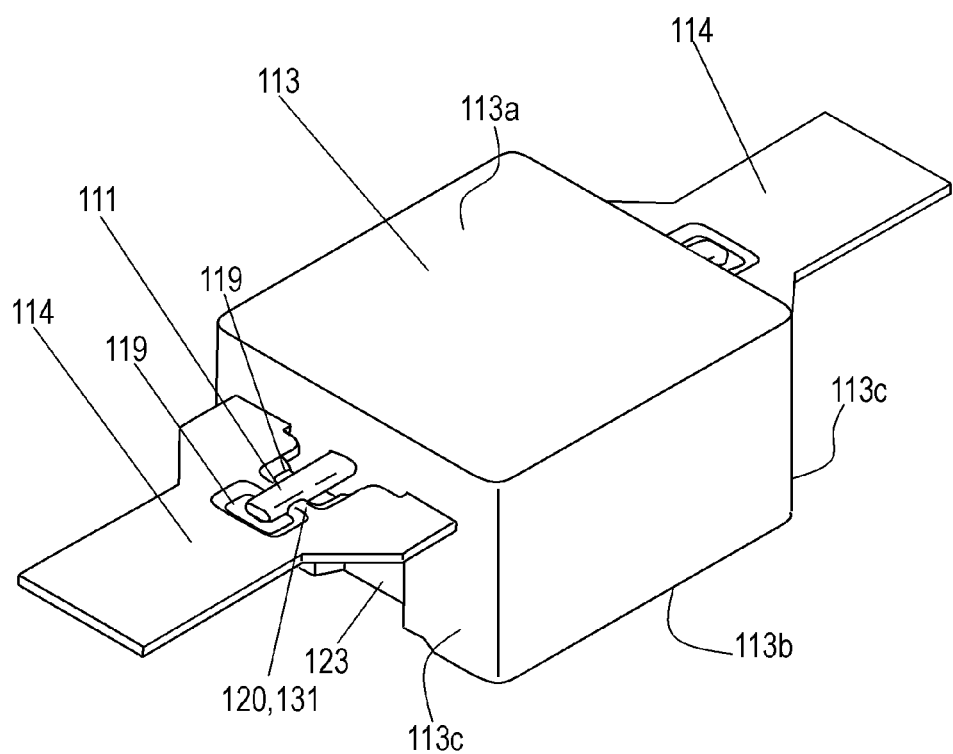
FIG. 25 is a perspective view of the electronic component in accordance with Embodiment 2 for illustrating the method of manufacturing the electronic component.

A method of manufacturing electronic component 115 will be described below. FIG. 14 and FIG. 15 are perspective views of electronic component 115 for illustrating the method of manufacturing electronic component 115. FIG. 16 is a partial enlarged view of electronic component 115 shown in FIG. 15. FIG. 17 is a sectional view of electronic component 115 along line XVII-XVII shown in FIG. 16. FIG. 18 is a perspective view of electronic component 115 for illustrating the method of manufacturing electronic component 115. FIGS. 19 to 22 are sectional views of electronic component 115 for illustrating the method of manufacturing electronic component 115. FIG. 23 to FIG. 25 are perspective views of electronic component 115 for illustrating the method of manufacturing electronic component 115.

As shown in FIG. 14, circuit element 112 including lead-out conductor 111 is prepared.

An insulated conductive wire having a welding layer provided thereon is wound on a predetermined winding shaft, and lead-out conductors 111 at both ends of the insulated conductive wire are led out in directions opposite to each other. Then, hot air is blown or solvent is dripped to a wound part of the insulated conductive wire to cure the welding layer. The conductive wire is removed from the winding shaft while maintaining the shape of the wound part, hereby providing circuit element 112 which is an air-core coil. The insulated conductive wire includes a metal wire made of conductive copper and an insulation layer coating the metal wire. In accordance with Embodiment 3, the metal wire is made of copper.

Both ends of circuit element 112 constitute lead-out conductors 111 led out in the directions opposite to each other. The insulated coating on lead-out conductor 111 is removed previously for the resistance-welding onto terminal conductor 114. Each end of lead-out conductor 111 is pressed to have a flat shape. In accordance with Embodiment 2, the metal wire is made of pure copper and has a diameter of 0.3 mm. Lead-out conductor 111 is pressed such that length Lt in thickness direction $D_{Lt}$ becomes shorter than length Lw in width direction $D_{Lw}$. Length Lt of lead-out conductor 111 in thickness direction $D_{Lt}$ is 0.23 mm in accordance with Embodiment 2.

Next, as shown in FIG. 15 to FIG. 18, terminal conductor 114 including projection 120 projecting from surface 116 is prepared by pressing a metal plate. FIG. 16 shows part DD of terminal conductor 114 shown in FIG. 15.

Terminal conductor 114 is formed by pressing a copper plate made of pure copper and having a thickness of 0.15 mm First, two protrusions 118 are formed at both ends of an edge close to body 113 to allow the edge have a squared-C shape. Terminal conductor 114 is fixed to body 113 by embedding protrusions 118 into body 113. FIG. 10 does not illustrate circuit element 112 and protrusions 118 disposed inside body 113, and illustrates lead-out conductor 111 led out from body 113.

Recesses 119 are formed in an area of the terminal conductor including a portion to be placed on lead-out terminal 111 of circuit element 112 between two protrusions 118 of terminal conductor 114 by pressing the terminal conductor to emboss from surface 116 to surface 117.

Projection 120 projecting from surface 116 opposite to surface 117 of terminal conductor 114 is formed between bottom surfaces 121 of recesses 119.

Projection 120 linearly extends in longitudinal direction $D_{Pll}$ crossing lead-out terminal 111. Recess 122 is formed in surface 117 at a position opposite to projection 120.

A tip of projection 120 is flush with surface 116 of terminal conductor 114. Flat part 131 surrounded by two long sides extending in longitudinal direction $D_{Pll}$ of projection 120 and two short sides extending in lateral direction $D_{Psl}$ perpendicular to longitudinal direction $D_{Pll}$ is provided at the tip of projection 120.

Length Pll of projection 120 in longitudinal direction $D_{Pll}$ is longer than length Lw of lead-out conductor 111 in width direction $D_{Lw}$. Similarly to projection 13 of conductor 12 in conductor assembly 16 in accordance with Embodiment 1 shown in FIG. 4, a cross section of projection 120 perpendicular to longitudinal direction $D_{Pll}$ has substantially an isosceles trapezoid shape 713 shown in FIG. 17.

Isosceles trapezoid shape 713 of projection 120 is formed by virtual line 134 passing through the center of the thicknesses of projection 120 and terminal conductor 114.

Flat part 131 constitutes upper base 713a of isosceles trapezoid shape 713 while an opening in recess 122 constitutes lower base 713b. Lower base 713b is a line connecting the center of terminal conductor 114 at both ends of the opening in recess 122. Legs 713c and 713d of isosceles trapezoid shape 713 are constituted by parts 814a and 814b which rise from both ends of the opening in recess 119 of terminal conductor 114 and which are connected to flat part 131.

Internal angle Pθ at both ends of lower base 713b of isosceles trapezoid shape 713, i.e., an angle of parts 814a and 814b of terminal conductor 114 rising from bottom surface 121 of recess 119, is an acute angle ranging from 45° to 70°. In accordance with Embodiment 2, internal angle Pθ is 55°.

In accordance with Embodiment 2, length Psl of projection 120 in lateral direction $D_{Psl}$, which is the length of flat part 131 constituting upper base 713a of isosceles trapezoid shape 713, is 0.5 to 3.0 times the length Tt of terminal conductor 114 in thickness direction $D_{Tt}$. If length Psl of projection 120 in lateral direction Desi is smaller than 0.5 times the length Tt of terminal conductor 114 in thickness direction $D_{Tt}$, distance Ts between two tips 133 is narrow, and causes a valley between two tips 133 to be excessively shallow. This configuration unpreferably reduces the effect of increasing the bonding area. If length Psl of projection 120 in lateral direction $D_{Psl}$ is longer than 3.0 times the length Tt of terminal conductor 114 in thickness direction $D_{Tt}$, an area of flat part 131 is enlarged, and contact resistance is reduced in embossing projection welding. This unpreferably makes the bonding state unstable. In accordance with the embodiment, length Psl of projection 120 in lateral direction $D_{Psl}$ is 1.4 times the length Tt of terminal conductor 114 in thickness direction $D_{Tt}$.

Height Ph by which projection 120 projects is equal to or larger than length Tt of terminal conductor 114 in thickness direction $D_{Tt}$, and is smaller than length Lt of lead-out terminal 111 in thickness direction $D_{Lt}$.

Height Ph of projection 120 equal to or larger than length Tt of terminal conductor 114 in thickness direction $D_{Tt}$ preferably allows projection 120 to easily enter into lead-out conductor 111 by embossing projection welding. In accordance with the embodiment, height Ph of projection 120 is 1.3 times the length Tt of terminal conductor 114 in thickness direction $D_{Tt}$.

Height Ph of projection 120 smaller than length Lt of lead-out conductor 111 in thickness direction $D_{Tt}$ preferably prevents the welding electrode pressing lead-out conductor 111 from contacting projection 120.

Single terminal conductor 114 may be formed as a chip. However, as shown in FIG. 15, plural terminal conductors 114 can be produced continuously by linking terminal conductors 114 as a hoop material. This configuration preferably enhances productivity.

Next, as shown in FIG. 18, lead-out conductor 111 is placed on terminal conductor 114 such that a welding part of lead-out conductor contacts flat part 131 of projection 120.

Lead-out conductor 111 is placed on terminal conductor 114 such that longitudinal direction $D_{Pll}$ of projection 120 preferably crosses the extending direction of lead-out conductor 111. Length Pll of projection 120 in longitudinal direction $D_{Pll}$ is preferably longer than length Lw of lead-out conductor 111 in width direction $D_{Lw}$.

This configuration allows lead-out conductor 111 and terminal conductor 114 to be positioned easily, and allows terminal conductor 114 to enter into lead-out conductor 111 entirely in width direction $D_{Lw}$.

lead-out conductor 111 and terminal conductor 114 placed on each other are tentatively fixed typically with a jig to avoid a positional deviation.

Figure 19:
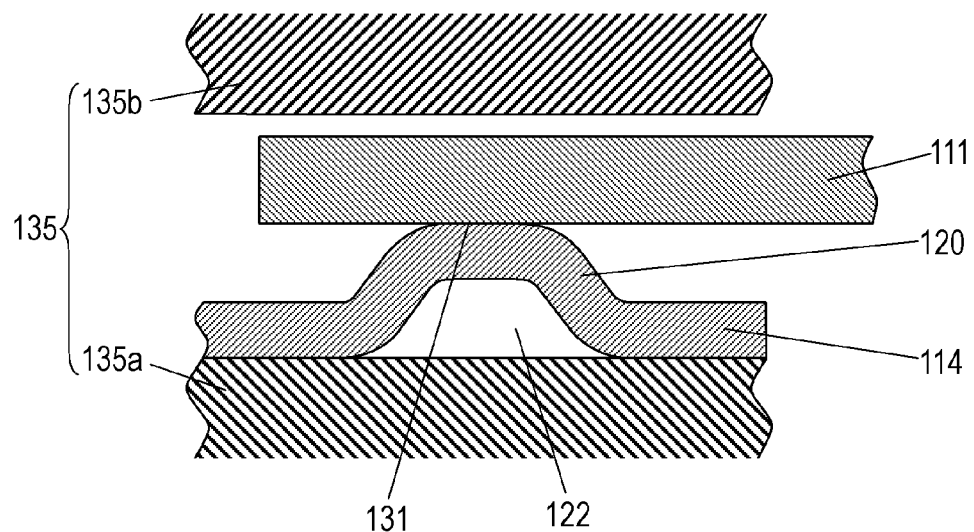
FIG. 19 is a perspective view of the electronic component in accordance with Embodiment 2 for illustrating the method of manufacturing the electronic component.

Next, as show in FIG. 19, lead-out conductor 111 and terminal conductor 114 placed on each other are placed on welding electrode 135 of a welding device.

Welding electrode 135 includes fixed welding electrode 135a attached to a fixed welding head of the welding device, and a movable welding electrode 135b attached to a movable welding head of the welding device. Movable welding electrode 135b moves toward fixed welding electrode 135a to press lead-out conductor 111 and terminal conductor 114 and sandwich lead-out conductor 111 and terminal conductor 114 between movable welding electrode 135b and fixed welding electrode 135a.

Fixed welding electrode 135a has a flat surface at a tip thereof. Recess 119 of terminal conductor 114 is placed on this flat surface. A flat surface shown in FIG. 19 is provided at the tip of movable welding electrode 135b. The tip of movable welding electrode 135b may have a slightly convex surface. In the case that the tip is convex, lead-out conductor 111 and terminal conductor 114 are placed between fixed welding electrode 135a and movable welding electrode 135b such that the tip of the convex surface is aligned to projection 120.

FIGS. 19 to 22 are sectional views of electronic component 115 viewing in the same direction as FIG. 17, and shows essential parts of lead-out conductor 111 including projection 120, terminal conductor 114, and welding electrode 135.

Figure 20:
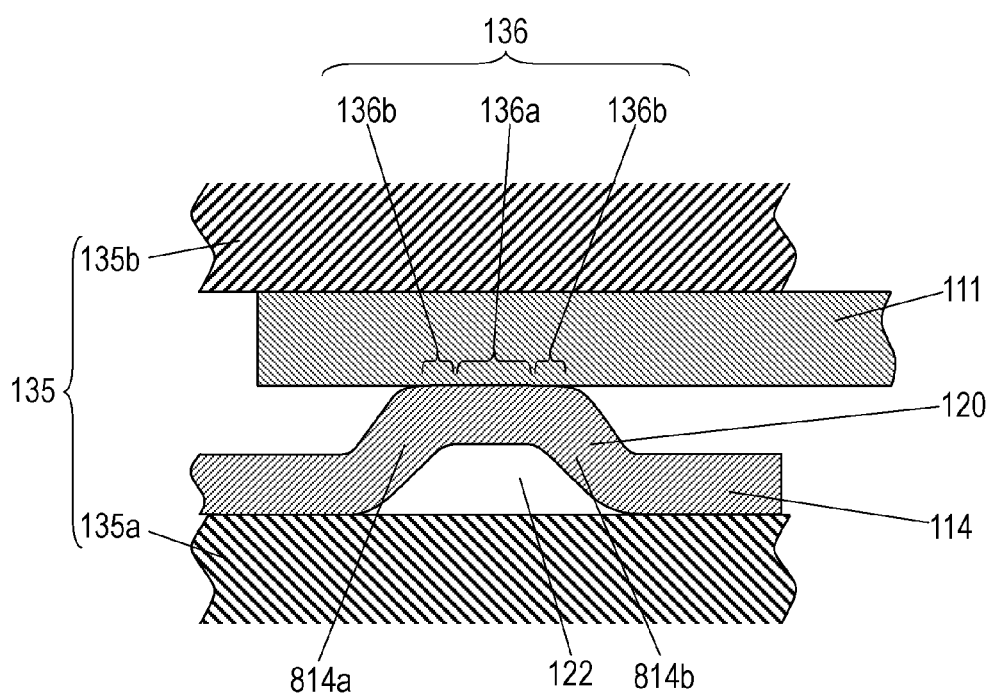
FIG. 20 is a perspective view of the electronic component in accordance with Embodiment 2 for illustrating the method of manufacturing the electronic component.

Next, as shown in FIG. 20, movable welding electrode 135b is moved toward fixed welding electrode 135a to apply a pressurizing force and sandwich lead-out conductor 111 and terminal conductor 114 without applying a current between welding electrodes 135. This initial pressurization presses projection 120 until height Ph of projection 120 becomes about 70% to 80% of the original height before the pressing.

Since flat part 131 at the tip of projection 120 is flush with flat portion 216 of surface 116 of terminal conductor 114, a sudden collapse of entire projection 120 due to the initial pressurization before applying a current between welding electrodes 135 can be suppressed when welding electrodes 135 apply the pressurizing force, thereby stabilizing a contact resistance between projection 120 and lead-out conductor 111.

In a projection having a flat shape formed by embossing from a surface of the terminal conductor opposite to a surface placed on the lead-out conductor, a tip of the projection extends and the strength of projection is decreased. The entire projection may thus suddenly collapse at the initial pressurization by welding electrodes 135. In electronic component 115 in accordance with Embodiment 2, flat part 131 at the tip of projection 120 does not extend and is flush with flat portion 216 of surface 116 surrounding terminal conductor 114. This configuration prevents a sudden collapse of entire projection 120 by the initial pressurization of welding electrodes 135.

Since an angle at a portion connected to bottom surface 121 of recess 119 of terminal conductor 114 and flat part 131 is 55°, parts 814a and 814b of projection 120 receive the initial pressurization from movable welding electrode 135b to suppress a large collapse of projection 120. Accordingly, the pressurizing force can be larger than an electronic component with smoothly convex projection.

Length Pll of projection 120 in longitudinal direction $D_{Pll}$ is longer than length Lw of lead-out conductor 111 in width direction $D_{Lw}$. Projection 120 thus has a portion which is not placed on lead-out conductor 111, hence preventing a large collapse of projection 120.

In the case that the projection is smoothly convex, a contact area of conductors changes drastically even due to a slight collapse of a convex portion at the tip. Accordingly, when a collapse at the tip of projection is small when a current is applied between the welding electrodes, contact resistance increases, and sudden melting occurs. This has a risk of scattering or explosion. Conversely, when a collapse at the tip is heavy, the contact resistance decreases, and can hardly generate resistance heat, hence providing unstable bonding.

In contrast, in electronic component 115 in accordance with Embodiment 2, projection 120 has an isosceles trapezoidal shape hardly collapsed. Accordingly, even if projection 120 is pressed and collapsed until height Ph of projection 120 becomes about 70% to 80% of the original height, a large change of contact area between lead-out conductor 111 and terminal conductor 114 can be suppressed. A large pressurizing force and a small change of contact area provide stable contact resistance between lead-out conductor 111 and terminal conductor 114. This configuration allows the applied current to be determined easily, and stabilizes the bonding.

Figure 21:
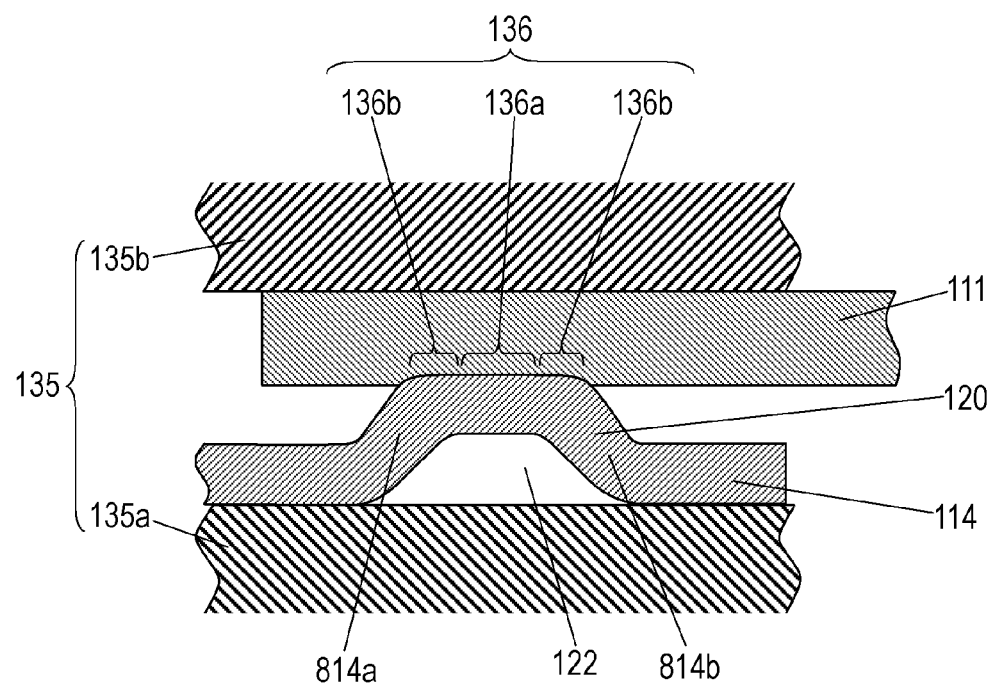
FIG. 21 is a perspective view of the electronic component in accordance with Embodiment 2 for illustrating the method of manufacturing the electronic component.

Next, as shown in FIG. 21, resistance heat is generated at a contact portion of lead-out conductor 111 and terminal conductor 114 by applying a current between welding electrodes 135, as shown in FIG. 21.

After the initial pressurization applied from welding electrodes 135, the contact resistance increases at both sides 136b of contact area 136 where lead-out conductor 111 contacts terminal conductor 144, compared to center 136a of contact area 136. Since projection 120 expands to contact both sides 136b of contact area 136 due to the initial pressurization from welding electrodes 135, the applied pressurizing force at both sides 136b is smaller than that at center 136a of contact area 136. Contact resistance at both sides 136b thus becomes higher than that at center 136a.

Therefore, when a current is stared applying after the initial pressurization from welding electrodes 135, the current concentrates on center 136a of contact area 136 where contact resistance is low, and generates resistance heat.

Then, when the resistance heat increases, the resistance at center 136a of contact area 136 increases since copper has a positive temperature coefficient of resistance. A portion where the current concentrates spreads toward both sides 136b of contact area 136, and increases the resistance heat accordingly.

Then, entire contact area 136 is softened by the resistance heat at a temperature ranging from about 900° C. to 1050° C., which is lower than the melting point, and center 136a and both sides 136b of contact area 136, which is parts of projection 120 of terminal conductor 114, enter into lead-out conductor 111 by a subsequent pressurizing force of welding electrodes 135.

A portion between two tips 133 thus enters into lead-out conductor 111 at bonded surface 132 of lead-out conductor 111 and terminal conductor 114.

Figure 22:
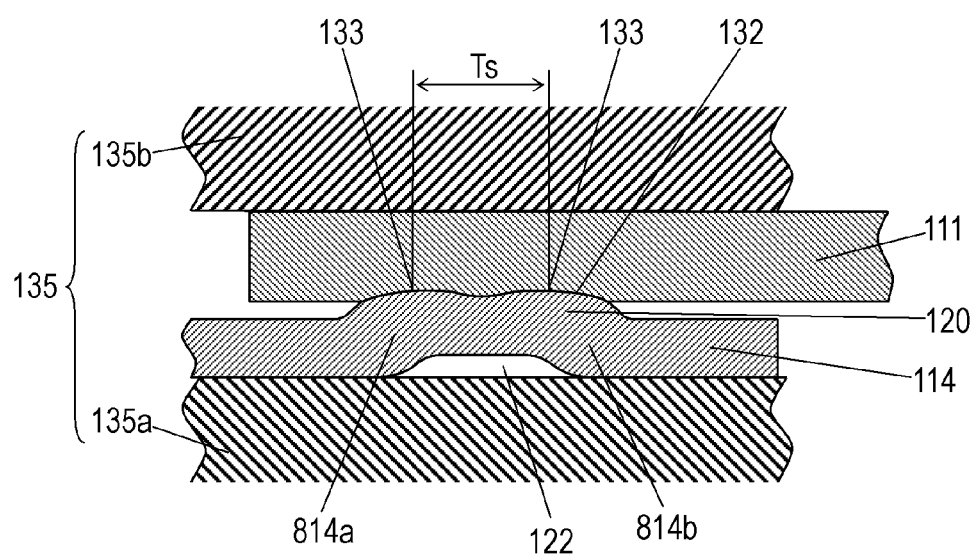
FIG. 22 is a perspective view of the electronic component in accordance with Embodiment 2 for illustrating the method of manufacturing the electronic component.

As shown in FIG. 22, when a part of projection 120 of terminal conductor 114 enters into lead-out conductor 111, lead-out conductor 111 contacts projection 120 of terminal conductor 114 more securely at a portion extending outward from both sides 136b of contact area 136. Similarly, a part of projection 120 of terminal conductor 114 enters into the area of lead-out conductor as resistance heat is generated and softening occurs at a temperature lower than the melting point.

Since an angle (internal angle Pθ) rising from parts 814a and 814b of projection 120 is 55°, entire projection 120 is not suddenly softened and collapses due to the pressurizing force of welding electrodes 135. In addition, lead-out conductor 111 can easily contact terminal conductor 114 at a peripheral portion of both sides 136b of contact area 136.

Internal angle Pθ at both ends of lower base 713b of isosceles trapezoid shape 713, i.e., an angle rising from parts 814a and 814b of projection 120, is preferably an acute angle ranging from of 45° to 70°. In the case that internal angle Pθ is smaller than 45°, entire projection 120 unpreferably tends to collapse. In the case that internal angle Pθ is larger than 70°, lead-out conductor 111 and terminal conductor 114 hardly contact outside both sides 136b of contact area 136, which is not preferable. Internal angle Pθ may range more preferably from 50° to 65°.

At a portion of new contact outside both sides 136b of contact area 136, a portion of parts 814a and 814b of projection 120 which has not been softened transfers the pressurizing force of welding electrodes 135 to a softened portion of parts 814a and 814b, and pushes the softened portion into lead-out conductor 111. This configuration provides bonded surface 132 with two tips 133 with center 136a of contact area 136 in between, as shown in FIG. 21 and FIG. 22.

Embossing projection welding can be completed by a small resistance heat due to large contact area 136, or by controlling movement of welding electrodes 135.

The pressurizing force and the current between welding electrodes 135 may be controlled to change according to the softening state of lead-out conductor 111 and projection 120 of terminal conductor 114. This configuration can adjust the height of two tips 133.

By embossing projection welding of lead-out conductor 111 and terminal conductor 114 as above, lead-out conductor 111 sinks into projection 120, as shown in FIG. 23, and a portion where projection 120 and lead-out conductor 111 contact is bonded.

Next, as shown in FIG. 24, body 113 accommodating circuit element 112 and one end of terminal conductor 114 therein is formed.

Body 113 can be formed by the following method. First, magnetic granule is formed by mixing magnetic metal powder mainly containing iron with binder made of thermosetting resin. The magnetic granule, circuit element 112, and protrusion 118 of terminal conductor 114 are inserted in a mold die and pressure-molded to form body 113.

Housing groove 123 extending from the side surface to the lower surface of body 113 is formed with the mold die. Recess 119 sinking to surface 117 of terminal conductor 114 is housed in housing groove 123.

Heat is applied to pressure-molded body 113 to thermally cure the binder made of thermosetting resin. This configuration firmly fixes protrusion 118 of terminal conductor 114 into side surface 113c of body 113.

Next, as shown in FIG. 25, each piece of electronic component 115 is cut from the hoop.

Each piece is cut by the press such that terminal conductor 114 has a predetermined length and shape when cut from the hoop. After cutting the hoop into individual pieces, the surface of terminal conductor 114 is preferably soldered typically by dipping terminal conductor 114 in molten solder so as to ensure mounting onto a mounting board.

Recess 119 out of plural recesses 119 which is closest to body 113 is not completely surrounded by bottom surface 121 and inner wall 119b, and has an opening toward body 113. Lead-out conductor 111 is resistance-welded such that lead-out conductor 111 sinks into projection 120. When lead-out conductor 111 sinks in this opening, lead-out conductor 111 is prevented from contacting flat part 216 around terminal conductor 114 with area and strength different from projection 120 at a portion near body 113. This can prevent unstable welding.

Since flat part 131 at the tip of projection 120 is flush with flat portion 216 of surface 116 of terminal conductor 114, the strength of projection 120 is increased. Accordingly, when the pressurizing force is applied by welding electrodes 135, a sudden collapse of entire projection 120 by the initial pressurization before applying current between welding electrodes 135 is suppressed. This provides stable contact resistance between projection 120 and lead-out conductor 111.

Finally, terminal conductor 114 is bent if necessary. Electronic component 115 in accordance with Embodiment 2 is a surface-mountable electronic component. Surface-mountable electronic component 115 shown in FIG. 10 is provided by bending terminal conductor 114 along side surface 113c to lower surface 113b of body 113.

In electronic component 115 in accordance with Embodiment 2, two recesses 119 are successively formed. However, for example, two projections 120 may be formed between two pairs of adjacent recesses 119 by successively forming three recesses 119. In this case, tips of two projections 120 are flush with surface 116 of terminal conductor 114 to provide no difference in height of two projections 120. Accordingly, when lead-out conductor 111 is placed on two projections 120 and embossing projection welding is performed, any difference in the welding state at each bonded portion can be suppressed. Accordingly, a further larger bonding area enables to increase the bonding strength.

REFERENCE MARKS IN THE DRAWINGS 11 conductor
12 conductor
13 projection
14 recess
15 flat part
16 conductor assembly
17 bonded surface
18 tip
19 imaginary line 20 welding electrode
20a fixed welding electrode
20b movable welding electrode
21 contact area
21a center of contact area
21b both sides of contact area
111 lead-out conductor
112 circuit element
113 body
114 terminal conductor
115 electronic component
118 protrusion
119 recess
120 projection
121 bottom surface
122 recess
123 housing groove
131 flat part
132 bonded surface
133 tip
134 imaginary line
135 welding electrode
135a fixed welding electrode
135b movable welding electrode
136 contact area

The invention claimed is:

1. A conductor assembly comprising:
a first conductor made of metal; and
a second conductor made of a metal plate having a first surface and a second surface opposite to the first surface, the second conductor being bonded to the first conductor, wherein
the second conductor includes a projection locally projecting from the first surface,
a recess is provided in the second surface of the second conductor opposite to the projection,
the projection of the second conductor includes a portion contacting and entering into the first conductor, the portion of the projection of the second conductor being joined to the first conductor,
the portion of the projection of the second conductor includes two tips and a valley portion between the two tips, the two tips locally projecting from the portion of the projection of the second conductor and entering into the first conductor, the valley portion being depressed with respect to the two tips,
the valley portion enters into the first conductor together with the two tips, and
the first conductor does not directly contact the second surface of the second conductor.

2. The conductor assembly of claim 1, wherein a distance between the two tips is 0.5 to 3.0 times a thickness of the second conductor.

3. A method of manufacturing the conductor assembly of claim 1, comprising:
preparing the first conductor made of metal;
preparing the second conductor made of the metal plate having the first surface and the second surface opposite to the first surface, the first surface including a projection locally projecting from the first surface, the second surface having a recess therein opposite to the projection; and
resistance-welding a portion of the projection of the second conductor to the first conductor while forming two tips locally projecting from the portion of the projection of the second conductor and entering into the first conductor.

4. The method of claim 3, wherein said preparing the second conductor comprises forming the projection and the recess by pressing the metal plate.

5. The method of claim 3, wherein said resistance-welding the portion of the projection of the second conductor to the first conductor comprises resistance-welding the portion of the projection of the second conductor to the first conductor while softening a portion of the projection and forming the two tips by pushing the softened portion of the projection into the first conductor.

6. An electronic component comprising:
the conductor assembly of claim 1;
a circuit element having a lead-out conductor which is the first conductor of the conductor assembly;
a body accommodating a part of the circuit element therein; and
a terminal conductor which is the second conductor of the conductor assembly.

7. A method of manufacturing the electronic component of claim 6, comprising:
preparing the circuit element including a lead-out conductor made of metal;
preparing the terminal conductor made of a metal plate having a first surface and a second surface opposite to the first surface, the terminal conductor including a projection which is provided at the first surface and which projects locally from an area adjacent to the projection;
resistance-welding the projection to the lead-out conductor; and
forming a body accommodating a part of the circuit element.

8. The method of claim 7, wherein
a first recess and a second recess is provided in the first surface of the metal plate of the terminal conductor, and
the projection is located between the first recess and the second recess, and an upper surface of the projection is higher than a bottom surface of the first recess and a bottom surface of the second recess relative to an upper surface of the body.

9. The method of claim 8, wherein
said preparing the terminal conductor comprises forming the plurality of dents, the plurality of protrusions, and the projection on the metal plate by pressing, and
said resistance-welding the projection to the lead-out conductor is executed after said preparing the terminal conductor.

10. The electronic component of claim 6, wherein
the first conductor is disposed on a first portion of the projection of the second conductor such that the projection of the second conductor contacts the first conductor from a first side edge of the first conductor to a second side edge of the first conductor opposite to the first side edge of the first conductor, and
the two tips and the valley portion of the projection of the second conductor enter into an entire portion of the first conductor.

11. The electronic component of claim 10, wherein the projection of the second conductor further includes a second portion which is not covered by the first conductor when viewed in plan.

12. The electronic component of claim 6, wherein
the first surface of the second conductor includes a portion which is adjacent to the projection and which is connected to the projection, and
at least the portion of the first surface of the second conductor is located away from the first conductor with a space between the first conductor and the portion of the first surface of the second conductor.

13. The electronic component of claim 6, wherein the first surface of the second conductor has a portion except the projection, the portion of the first surface of the second conductor being located away from the first conductor with a space between the first conductor and the portion of the first surface of the second conductor.

14. The electronic component of claim 6, wherein a part of the first surface of the second conductor which is located at the valley portion contacts the first conductor.

15. The electronic component of claim 6, wherein
a first recess and a second recess is provided in the first surface of the second conductor, and
the projection is located between the first recess and the second recess, and an upper surface of the projection is higher than a bottom surface of the first recess and a bottom surface of the second recess relative to an upper surface of the body.

16. The conductor assembly of claim 1, wherein
the first conductor is disposed on a first portion of the projection of the second conductor such that the projection of the second conductor makes contact with the first conductor from a first side edge of the first conductor to a second side edge of the first conductor opposite to the first side edge of the first conductor, and
the two tips and the valley portion of the projection of the second conductor enter into an entire portion of the first conductor.

17. The conductor assembly of claim 16, wherein the projection of the second conductor further includes a second portion which is not covered by the first conductor when viewed in plan.

18. The conductor assembly of claim 1, wherein
the first surface of the second conductor includes a portion adjacent to the projection and which is connected to the projection, and
at least the portion of the first surface of the second conductor is located away from the first conductor with a space between the first conductor and the portion of the first surface of the second conductor.

19. The conductor assembly of claim 1, wherein the first surface of the second conductor has a portion except the projection, the portion of the first surface of the second conductor being located away from the first conductor with a space between the first conductor and the portion of the first surface of the second conductor.

20. The conductor assembly of claim 1, wherein the first conductor and the second conductor contain copper.

21. The conductor assembly of claim 1, wherein a part of the first surface of the second conductor which is located at the valley portion contacts the first conductor.

22. A conductor assembly comprising:
a first conductor made of metal; and
a second conductor made of a metal plate having a first surface and a second surface opposite to the first surface, the second conductor being bonded to the first conductor, wherein
the second conductor includes a projection locally projecting from the first surface,
a recess is provided in the second surface of the second conductor opposite to the projection,
the projection of the second conductor includes a portion contacting and entering into the first conductor, the portion of the projection of the second conductor being jointed to the first conductor,
the portion of the projection of the second conductor includes two tips and a valley portion between the two tips, the two tips being locally projecting from the portion of the projection of the second conductor and entering into the first conductor, the valley portion being depressed with respect to the two tips,
the valley portion enters into the first conductor together with the two tips, and
the first conductor and the second conductor contain copper.

23. A conductor assembly comprising:
a first conductor made of metal; and
a second conductor made of a metal plate having a first surface and a second surface opposite to the first surface, the second conductor being bonded to the first conductor, wherein
the second conductor includes a projection locally projecting from the first surface,
a recess is provided in the second surface of the second conductor opposite to the projection,
the projection of the second conductor includes a portion contacting and entering into the First conductor, the portion of the projection of the second conductor being jointed to the first conductor,
the portion of the projection of the second conductor includes two tips and a valley portion between the two tips, the two tips being locally projecting from the portion of the projection of the second conductor and entering into the first conductor, the valley portion being depressed with respect to the two tips,
the valley portion enters into the first conductor together with the two tips,
the first conductor is disposed on a first portion of the projection of the second conductor such that the projection of the second conductor makes contact with the first conductor from a first side edge of the first conductor to a second side edge of the first conductor opposite to the first side edge of the first conductor, and
the two tips and the valley portion of the projection of the second conductor enter into an entire portion of the first conductor.

24. The conductor assembly of claim 23, wherein the projection of the second conductor further includes a second portion which is not covered by the first conductor when viewed in plan.

25. A conductor assembly comprising:
a first conductor made of metal; and
a second conductor made of a metal plate having a first surface and a second surface opposite to the first surface, the second conductor being bonded to the first conductor, wherein
the second conductor includes a projection locally projecting from the first surface,
a recess is provided in the second surface of the second conductor opposite to the projection,
the projection of the second conductor includes a portion contacting and entering into the first conductor, the portion of the projection of the second conductor being jointed to the first conductor,
the portion of the projection of the second conductor includes two tips and a valley portion between the two tips, the two tips being locally projecting from the portion of the projection of the second conductor and entering into the first conductor, the valley portion being depressed with respect to the two tips,
the valley portion enters into the first conductor together with the two tips, the first surface of the second conductor includes a portion which surrounds the projection and which is connected to the projection, and at least the portion of the first surface of the second conductor is located away from the first conductor with a space between the first conductor and the portion of the first surface of the second conductor.

26. A conductor assembly comprising:

a first conductor made of metal; and a second conductor made of a metal plate having a first surface and a second surface opposite to the first surface, the second conductor being bonded to the first conductor, wherein the second conductor includes a projection locally projecting from the first surface, a recess is provided in the second surface of the second conductor opposite to the projection, the projection of the second conductor includes a portion contacting and entering into the first conductor, the portion of the projection of the second conductor being jointed to the first conductor, the portion of the projection of the second conductor includes two tips and a valley portion between the two tips, the two tips being locally projecting from the portion of the projection of the second conductor and entering into the first conductor, the valley portion being depressed with respect to the two tips, the valley portion enters into the first conductor together with the two tips, and a portion of the first surface of the second conductor except the projection is located away from the first conductor with a space between the first conductor and the portion of the first surface of the second conductor.

* * * * *